(12) United States Patent
Rieken et al.

(10) Patent No.: US 11,713,254 B2
(45) Date of Patent: Aug. 1, 2023

(54) HIGH TEMPERATURE SUPERCONDUCTING MATERIAL AND A METHOD FOR PRODUCTION

(71) Applicant: TRUE 2 MATERIALS PTE LTD., Singapore (SG)

(72) Inventors: William Rieken, Singapore (SG); Atit Bhargava, Singapore (SG)

(73) Assignee: True 2 Materials PTE LTD., Singapore (SG)

( * ) Notice: Subject to any disclaimer, the term of this patent is extended or adjusted under 35 U.S.C. 154(b) by 702 days.

(21) Appl. No.: 16/604,377

(22) PCT Filed: Apr. 10, 2018

(86) PCT No.: PCT/GB2018/000063
§ 371 (c)(1),
(2) Date: Oct. 10, 2019

(87) PCT Pub. No.: WO2018/189500
PCT Pub. Date: Oct. 18, 2018

(65) Prior Publication Data
US 2020/0156955 A1    May 21, 2020

(30) Foreign Application Priority Data

Apr. 10, 2017 (SG) .............................. 10201702942T
Dec. 13, 2017 (SG) ........................... 10201710381W

(51) Int. Cl.
*C01G 3/00* (2006.01)
(52) U.S. Cl.
CPC .......... *C01G 3/006* (2013.01); *C01P 2002/50* (2013.01); *C01P 2002/60* (2013.01);
(Continued)

(58) Field of Classification Search
CPC .............. C01P 2004/16; C01P 2004/13; C01P 2002/60; C01P 2002/50; C01G 3/006
See application file for complete search history.

(56) References Cited

U.S. PATENT DOCUMENTS

| 4,839,339 | A | | 6/1989 | Bunker et al. |
| 4,994,437 | A | * | 2/1991 | Torii ..................... C04B 41/009 427/430.1 |
| 2007/0194225 | A1 | | 8/2007 | Zorn |

FOREIGN PATENT DOCUMENTS

| CN | 1209424 A | 3/1999 |
| WO | 02071501 A | 9/2002 |

OTHER PUBLICATIONS

International Search Report and Written Opinion, PCT/GB2018/000063, dated Aug. 20, 2018, 17 pages.
(Continued)

*Primary Examiner* — Paul A Wartalowicz
(74) *Attorney, Agent, or Firm* — Stinson LLP

(57) ABSTRACT

A process for producing a process for producing a $LnM_2Cu_3O_x$ high-temperature superconductive powder, the process comprising:
i) providing an aqueous solution of Ln, M and Cu and at least one mineral acid;
ii) adding at least one sequestrating agent and, optionally, at least one dispersant to the solution to form a precipitate;
iii) recovering the precipitate from the solution; and
iv) heating the precipitate in a flow of oxygen to form the $LnM_2Cu_3O_x$ powder,
wherein Ln is a rare earth element, preferably Y, Ce, Dy, Er, Gd, La, Nd, Pr, Sm, Sc, Yb, or a mixture of two or more thereof, and
wherein M is selected from Ca, Sr, and Ba.

5 Claims, 17 Drawing Sheets

(52) U.S. Cl.
CPC ...... *C01P 2002/72* (2013.01); *C01P 2004/03* (2013.01); *C01P 2004/04* (2013.01); *C01P 2004/13* (2013.01); *C01P 2004/16* (2013.01); *C01P 2006/40* (2013.01); *C01P 2006/42* (2013.01)

(56) References Cited

OTHER PUBLICATIONS

Manthiram et al., "Synthesis of the high-Tc superconductor YBa2Cu3O7-delta in small particle size," Nature, Oct. 1987, vol. 329, pp. 701-703.

* cited by examiner

HIGH TEMPERATURE SUPERCONDUCTING MATERIAL AND A METHOD FOR PRODUCTION

REFERENCE TO RELATED APPLICATIONS

This application is a U.S. national stage application based on PCT/GB2018/000063 filed Apr. 10, 2018, claiming priority to Singapore application no. 10201702942T, filed Apr. 10, 2017 and Singapore application no. 10201710381W, filed Dec. 13, 2017, the entire disclosures of which are incorporated herein by reference.

FIELD OF INVENTION

This application relates to superconducting materials, more particularly to high temperature copper-based superconductors, making nanorods and nanotubes of high temperature superconductors, and application as a superconductive paint onto any substrate. Other applications include its use in an ink for ink-jet or spray style printing, its use in a composite material embedded via epoxies or other composite glues and related, metal matrix composites and related, 3D printer additive, SLA, sintering, molding in clay or other materials, subtractive, milling, or any combination thereof into or onto any substrate.

BACKGROUND OF THE INVENTION

In particular, the present invention relates to a method of making multiple morphologies of nanorods and/or nanotubes of $YBa_2Cu_3O_x$ and/or $YBa_2Cu_3O_x$ under influence of a further metal oxide, especially magnesium oxide (MgO), which has been found to make square-like objects, called crackers, and/or spiral spire like objects. Examples shown herein are based on $YBa_2Cu_3O_x$+MgO and/or $YBa_{(2-x)}Mg_{(x)}Cu_3O_y$, where x in the latter formula is Mg content somewhere between 0 and 0.9. Other morphologies can be achieved depending upon elemental influence. In particular the present invention highlights the composition $YBa_2Mg_{0.5}Cu_3O_y$. The nanorods and nanotubes superconduct at temperatures of about 90K. In other words, they are high-temperature superconductors. The process involves a careful control of solution chemistry and heat treatment processes to first prepare a precursor and then heat the precursor to grow the morphologies. Some of the nanorods appear to grow into nanotubes, particular when subjected to further heat-treatment e.g. by sintering. There is also disclosed a method to make a paint from the nanorods and/or nanotubes of $YBa_2Cu_3O_x$. The painted coating is also superconducting at temperatures below about 90K. These materials are made as a powder that can be shaped into wires or deposited as films.

Although the disclosure of the application focuses on $YBa_2Cu_3O_x$, or $YBa_{2-y}X_yCu_3O_x$ and/or $Y_2Ba_{2-y}X_yCuO_x$ high-temperature superconductive powder, it should be appreciated that the elements can be substituted for alternative elements as discussed below. For example, Y can be any rare earth element.

Research has highlighted the need for scalable processes in the fabrication of practical superconducting nanoscale powders, films and wires. Towards this need, wet, ion- and laser-beam fabrication methods have been reported and while these methods have their benefits, limitations within the materials produced, for example a lack of uniformity in crystal structure, grain-size, and brittleness, as well as in the fabrication processes, such as high-temperature annealing, scalability, are the current limitations.

High critical temperatures ($T_c$) and excellent superconducting properties have been traditionally obtained in single crystals since the early years of research into high temperature superconductive materials. Nanorods of metals and ceramic oxides have been made by heating metal in air, thermal evaporation and the vapour-solid-liquid (VSL) method. Such nanorods have been shown to exhibit interesting properties ranging from cancer treatments to electro-optics. In recent years, progress has been made in the synthesis of whiskers and nano fibres of high temperature superconductors. The properties of such nano fibres, when synthesized by melt-textured growth, show excellent superconducting capabilities and the potential application in solid state devices based on the Josephson effect and further properties are being researched. Crystal growth of $YBa_2Cu_3O_x$ has been achieved by growing crystals on anodised alumina substrates and laser ablation and by electrospinning. The prevalent method to make superconducting nanotubes is to first synthesize $YBa_2Cu_3O_x$ powder with Y:Ba:Cu=1:2:3 stoichiometry and subsequently deposit the powder onto a nanotube template such as carbon or alumina. The whiskers and nanorods reported thus far therefore, involve a high temperature process, over 1000° C., of post-manufacture texturing such as melt-growth or chemical vapour deposition to make the product superconducting.

Nanoscale powders are increasingly being researched for a variety of novel applications and to further progress in scientific understanding of the structure and behaviour of such powders. The size of the powder in this study is of interest due to the impact that a reduced size has on properties and applications. Besides being of fundamental scientific interest in the field of sub-nanoscale structures, nanoscale magnesium oxide (MgO), powder has application in nanowires, composites, nanofibers, and buffer layer in memory chips. Traditionally MgO is used in refractories, cements, paints and glazes for centuries—applications where traditional methods of fabricating suffice. However, over the last two decades, several techniques for synthesis of nanoscale powders have emerged, including wet chemistry, sol-gel, laser ablation and metal oxidation. These synthesis methods target applications such as anti-bacterial and anti-cancer treatments where small crystal size, oxygen vacancy, control of stoichiometry and 'doping' play an important role. Due to its large surface area and the oxygen stoichiometric imbalance generated by relative excess or deficit oxygen MgO has been shown to have toxicology properties.

MgO nanorods have previously been made using magnesium chloride and ammonium carbonate with calcination at 400° C. This powder showed good dye absorption with Malachite Green and Congo red. Other groups studied the detection and measurement of heavy metal ions in aquatic steams and the application of MgO made by reacting magnesium chloride in solution with 1,6-Hexanediamine, followed by calcination at 500° C. The powder displayed mesoporous sheets, which were held responsible for positive electrochemical properties in a solution of 'toxic' metal ions. Other groups have synthesized 20 nm MgO particles by metal oleate chemistry and studied cytotoxic effects on oxidative gene expression. In particular, they have showed that when magnesium hydroxide $Mg(OH)_2$ was calcined from 350° C. to 1200° C., the highly-disordered oxide systematically crystallizes to defined structures, surface energy decreases as crystallite size increases. The MgO powder created by processes mentioned above, typically have crystallite sizes of 20 to 100 nm and the processes are for small quantities.

SUMMARY OF THE INVENTION

Accordingly, it is desirable to provide an improved method and/or tackle at least some of the problems associated with the prior art or, at least, to provide a commercially useful alternative thereto. In particular, it is desirable to provide a method for synthesizing $YBa_2Cu_3O_x$ powder such that the powder does not require subsequent heat treatment or deposition onto a nanotube template to make it superconducting.

According to a first aspect there is provided a process for producing a $LnM_2Cu_3O_x$ high-temperature superconductive powder, the process comprising:
  i) providing an aqueous solution of Ln, M and Cu and at least one mineral acid;
  ii) adding at least one sequestrating agent and, optionally, at least one dispersant to the solution to form a precipitate;
  iii) recovering the precipitate from the solution; and
  iv) heating the precipitate in a flow of oxygen to form the $LnM_2Cu_3O_x$ powder,
  wherein Ln is a rare earth element, preferably Y, Ce, Dy, Er, Gd, La, Nd, Pr, Sm, Sc, Yb, or a mixture of two or more thereof, and
  wherein M is selected from Ca, Sr, and Ba.

Ln is a rare earth element, preferably Y, Ce, Dy, Er, Gd, La, Nd, Pr, Sm, Sc, Yb, or a mixture of two or more thereof. Other rare earth metals may also be used in addition or as alternatives. Most preferably Ln is Y.

M is selected from Ca, Sr, and Ba. Most preferably M is Ba.

The invention will now be described further with particular reference to powders comprising Y and Ba. Nonetheless, it should be recognised that the Y and Ba species may equally be substituted for the alternatives described herein.

Preferably there is provided a process for producing a $YBa_2Cu_3O_x$ high-temperature superconductive powder, the process comprising:
  i) providing an aqueous solution of Y, Ba and Cu and at least one mineral acid;
  ii) adding at least one sequestrating agent and, optionally, at least one dispersant to the solution to form a precipitate;
  iii) recovering the precipitate from the solution; and
  iv) heating the precipitate in a flow of oxygen to form the $YBa_2Cu_3O_x$ powder.

DETAILED DESCRIPTION OF PREFERRED EMBODIMENTS

Figure 1:
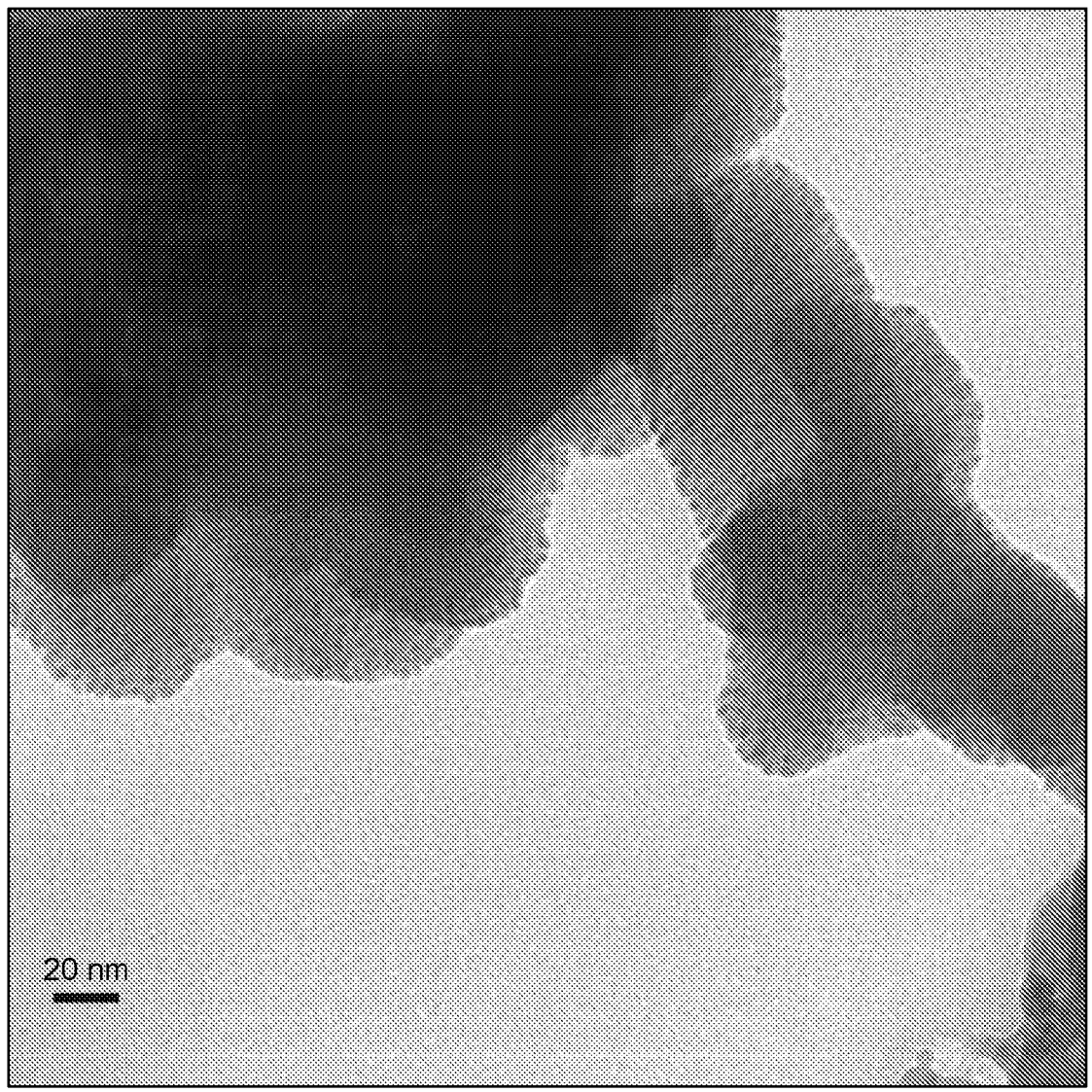
FIG. 1 shows a TEM image of a dried precipitate.

Surprisingly the present inventors have found a method which permits the growth of a high yield of nanorods, in particular of $YBa_2Cu_3O_x$, through a chemical process in a significant quantity of 1 kg or more. The powder formed at the outset is predominantly in the form of nanorods without the need for any post formation deposition on templates. Further, the powder is superconducting from the outset so there is no need to sinter or otherwise process it by either post-formation or post-fabrication.

The present invention will now be further described. In the following passages different aspects of the invention are defined in more detail. Each aspect so defined may be combined with any other aspect or aspects unless clearly indicated to the contrary. In particular, any feature indicated as being preferred or advantageous may be combined with any other feature or features indicated as being preferred or advantageous.

The present invention relates to a process for producing a $YBa_2Cu_3O_x$ high-temperature superconductive powder.

The process comprises several steps which can be carried out in order. For a continuous process it may be possible for the steps to overlap or for some of the steps to be carried out in an alternative order.

According to the first step there is provided an aqueous solution of Y, Ba and Cu and at least one mineral acid. Suitable salts for providing ions of Y, Ba and Cu are well known in the art, as are solutions for the alternative elements discussed herein. Preferably the Y, Ba and Cu are present in a molar ratio of approximately 1:2:3. That is, preferably the stoichiometry of the solution is similar to that of the desired product. Suitable concentrations of the cations could be determined by the person skilled in the art.

The mineral acid is preferably selected from hydrochloric, nitric and sulphuric acid and combinations thereof. The mineral acid may also contain one or both of formic acid and citric acid. The total acid concentration is preferably from 0.5 M to 2.5 M, more preferably from 0.7 to 1.4 M, and most preferably about 1 M.

According to the second step there is added at least one sequestrating agent and, optionally, at least one dispersant to the solution to form a precipitate. The sequestrating agent is preferably selected from citric acid, ammonium oxalate, formic acid, carbonic acid, tetramethylammonium hydroxide, oxalic acid, ammonia and combinations thereof. Preferably, the sequestrating agent is added in an amount of from 35 to 50 wt % by weight of the solution of step (i). The sequestrating agent may also act as a dispersant.

The optional dispersant is preferably polyunsaturated naphthalene. Other suitable dispersants include oils and fats, alkylphenols, mononucleotides, or carbon dioxide gas, which may be used as an alternative to or in addition to the polyunsaturated naphthalene. The dispersant helps to keep the resulting precipitate from coagulating. Preferably, the dispersant is added in an amount of from 0.1 to 8 wt % by weight of the solution of step (i).

Preferably the pH of the solution at the point of precipitation is from about 2.85 to 5.5, more preferably from 3 to 4, still more preferably about 3. Preferably, the sequestrating agent is added slowly, for example a few drops at a time. Preferably, the sequestrating agent is added over a period of from 10 minutes to 1 hour, preferably from 20 to 40 minutes. In one example, the precipitation pH was 3.0 and the time for adding the sequestrating agent was 35 minutes. The precipitation is preferably allowed to complete by stirring gently for 1 h to 8 h and typically about 1 h after the sequestrating agent has been added.

According to the third step the precipitate is recovered from the solution. This may be achieved by filtering the solution. Suitable filters for this are known in the art. The recovered precipitate is typically extremely finely grained, and preferably has a mean grain size of less than 10 nm, more preferably less than 8 nm, or from 5 to 8 nm. Surprisingly, the recovered precipitate, when examined by TEM, already shows signs of nanorod growth. Without wishing to be bound by theory, it is believed that careful control of pH and/or precipitation rate in the preceding steps may assist in nanorod formation.

According to the fourth step the precipitate is heated in a flow of oxygen to form the $YBa_2Cu_3O_x$ powder. Preferably this comprises heating the $YBa_2Cu_3O_x$ precursor in a flow of oxygen at a temperature of from 850° C. to 1000° C., preferably from 900 to 950° C., and most preferably about 950° C. Preferably, the precursor is heated at the aforementioned temperatures for from 10 to 40 hours, more preferably from 20 to 30 hours, most preferably about 25 hours. The fourth step may be carried out, for example, in a rotating furnace or fluidized bed.

It has been found that the $YBa_2Cu_3O_x$ high-temperature superconductive powder obtained by this process advantageously comprises nanorods and/or nanotubes, without the need for any post-formation deposition on nanostructure templates. The nanorods and nanotube structures develop over time as the precursor (i.e. the recovered precipitate) is heated. The nanostructure of the powder is generally predominantly comprised of nanorods, and preferably has a mean crystal size of from 3 to 7 nm, more preferably from 4 to 6 nm, and most preferably about 5 nm. This can be examined by TEM. Advantageously, the powder already exhibits high-temperature superconductivity at this stage without requiring further high-temperature processing such as sintering. Accordingly, in one embodiment, the process does not involve a sintering step subsequent to step iv).

Preferably the process involves steps of drying and/or calcining before the fourth step. Preferably, the precipitate is dried at a temperature of at least 70° C. and more preferably at least 100° C. Preferably, the precipitate is dried at a temperature of at most 150° C. This removes the bulk of the water before further processing. Preferably the precipitate is calcined at a temperature of from 350 to 700° C., more preferably 400 to 600° C., and most preferably about 500° C.

As noted above, nanorods are already present in a significant quantity in the powder as a result of step iv), without requiring a subsequent sintering step to achieve superconductivity. Preferably, however, the process further comprises a fifth step of sintering the $YBa_2Cu_3O_x$ powder at a temperature of from 930° C. to 1010° C., more preferably from 950 to 990° C., and most preferably from 960 to 980° C. to form a sintered high-temperature superconductive material. Preferably, the $YBa_2Cu_3O_x$ powder is sintered at the aforementioned temperatures for from 10 to 40 hours, more preferably from 20 to 30 hours. Upon sintering, the nanorods present in the powder sinter as expected, fusing along edges with other grains. Moreover, it has been found that some of the nanorods coil upon sintering to form nanotubes.

According to a further aspect there is provided a $YBa_2Cu_3O_x$ high-temperature superconductive powder obtainable by the process described herein for forming a superconductive powder.

According to a further aspect there is provided a sintered $YBa_2Cu_3O_x$ high-temperature superconductive material obtainable by the process described herein for forming a superconductive material.

According to a further aspect there is provided a process for producing a superconductive paint, the process comprising forming a dispersion of the $YBa_2Cu_3O_x$ high-temperature superconductive powder or material described herein in a liquid. The paint may be sprayed or painted by any known means onto a substrate.

Preferably the liquid comprises one of more of a binder, an ester and an alcohol. Examples of these ingredients include ethyl acetate, butyl acetate, methanol, chloroform, acetic acid, vinegar, varnishes and ethanol. In one preferred example, the liquid comprises ethyl acetate, butyl acetate and ethanol in a ratio of approximately 1:1:1 by volume.

According to a further aspect there is provided a paint obtainable by the process described above for forming a paint. According to a further aspect there is provided a paint comprising the $YBa_2Cu_3O_x$ high-temperature superconductive powder described herein.

According to a further aspect there is provided a method of providing a coating on a surface, the method comprising applying a coating comprising the paint described herein to the surface. Suitable surfaces include a variety of materials such as metal, composite, glass, paper, graphene, semiconductors, ceramic, etc.

According to a further aspect there is provided a surface comprising the coating described herein.

According to a further aspect there is provided a multilayer film comprising at least one superconducting layer, wherein the superconducting layer comprises the $YBa_2Cu_3O_x$ high-temperature superconductive powder or the sintered $YBa_2Cu_3O_x$ high-temperature superconductive material described herein, preferably wherein the multilayer film comprises
a) a primer layer;
b) a first insulating layer;
c) the superconducting layer;
d) a second insulating layer;
e) a barrier layer.

The method of applying the paint in multilayers can be used for any known oxide and more specifically any known high temperature copper based oxide, to make a superconductive painted product. Other techniques such as electrocoating, spraying, ion-beam implantation, or laser deposition techniques can also be applied to deposit the superconducting layer.

Advantageously, it has been found that the products produced from the superconductive powders and sintered materials described herein do not require post-sintering or oxygenation to render them superconductive, since the powders and sintered materials themselves are already superconductive. This is advantageous in that the state of the product (e.g. the paint, substrate or film) is preserved without undergoing any deleterious changes that could typically be brought about by a post-treatment step such as heat application.

A further aspect of the present invention relates to a nanoscale MgO created using a wet chemical processing method which subsequently consists of a single-step heat treatment. The process lends itself very well to variations in stoichiometry, metal to oxygen ratio and doping by trace elements in large quantities of powder. Importantly the powder made is often about 5 nm is size with most crystal aggregates being less than 20 nm.

According to this aspect, there is provided a process for producing MgO crystallites having a mean crystallite size of from 5 to 20 nm, the process comprising:
i) providing an aqueous solution of comprising Mg in at least one mineral acid;
ii) adding at least one sequestrating agent and, optionally, at least one dispersant to the solution to form a precipitate;
iii) recovering the precipitate from the solution; and
iv) heating the precipitate in a flow of oxygen to form the MgO powder.

Preferably the mean crystallite size is from 1 to 15 nm, preferably 10 to 15 nm.

Preferably the Mg in the aqueous solution is obtained by dissolving $MgCO_3$ in the at least one mineral acid.

All features described for the other aspects described herein can be freely combined with this aspect.

A further aspect of this invention relates to a discovery by the present inventors of a method for making nanoscale magnesium oxide. Moreover they have discovered that this has a surprising effect on creating new morphologies of $YBa_2Cu_3O_x$.

In particular, the inventors have investigated the influence of nanoscale magnesium oxide powder, prepared by a wet-chemical process on the morphology of the high temperature superconductor compound $YBa_2Cu_3O_x$. The instruments of X-ray diffraction, Scanning Electron Microscopy and Transmission Electron Microscopy have been used to identify the molecular size of MgO which is primarily 5 to 20 nm crystallites. The cubic structure of the MgO lattice is visible in the crystals and the shape is maintained in the loosely agglomerated grains. Heat treatment up to 1000° C. does not have any significant effect on increasing the crystal size as compared to heating times which causes in increase in crystal size. The inventors also discovered the functionalization of $YBa_2Cu_3O_x$ superconductor by MgO. Unique plate-like, multilayered plate-like or cracker-like with or without holes and/or spiral morphologies of superconducting $YBa_2Cu_3O_x$ were obtained when magnesium is co-precipitated with yttrium, barium and copper. While the superconducting transition temperature is about 93K and is unaffected, the addition of magnesium or other elements or compounds and or oxides causes distortion of the phase composition and crystal structure of the parent $YBa_2Cu_3O_x$.

According to this further aspect, there is provided a process for producing a $LnM_{2-y}X_yCu_3O_x$ and/or $Ln_2M_{2-y}X_yCuO_x$ high-temperature superconductive powder, the process comprising:
i) providing an aqueous solution of Ln, M, X and Cu and at least one mineral acid;
ii) adding at least one sequestrating agent and, optionally, at least one dispersant to the solution to form a precipitate;
iii) recovering the precipitate from the solution; and
iv) heating the precipitate in a flow of oxygen to form the $LnM_{2-y}X_yCu_3O_x$ and/or $Ln_2M_{2-y}X_yCuO_x$ powder,
wherein X is selected from the group consisting of Mg, Se, Sr, Ca and mixtures of two or more thereof,
wherein Ln is a rare earth element, preferably Y, Ce, Dy, Er, Gd, La, Nd, Pr, Sm, Sc, Yb, or a mixture of two or more thereof, and
wherein M is selected from Ca, Sr, and Ba.

Preferably the process is for producing a $YBa_{2-y}X_yCu_3O_x$ and/or $Y_2Ba_{2-y}X_yCuO_x$ high-temperature superconductive powder, the process comprising:
i) providing an aqueous solution of Y, Ba, X and Cu and at least one mineral acid;
ii) adding at least one sequestrating agent and, optionally, at least one dispersant to the solution to form a precipitate;
iii) recovering the precipitate from the solution; and
iv) heating the precipitate in a flow of oxygen to form the $YBa_{2-y}X_yCu_3O_x$ and/or $Y_2Ba_{2-y}X_yCuO_x$ powder,
wherein X is selected from the group consisting of Mg, Se, Sr, Ca and mixtures of two or more thereof. Where X is more than one element, the total relative molar content of each element is "y". Preferably "y" has a value of from 0 to 0.9, more preferably from 0.1 to 0.8. In one example, the element X is magnesium, Mg and its relative molar content is 0.5 giving the chemical formula as $YBa_{2-y}Mg_yCu_3O_x$ Preferably the product of this process has a stoichiometry of about or exactly $Y_2Ba_{1.5}Mg_{0.5}Cu_3O_x$.

Preferably the stoichiometry of the elements in step (i) is Y:Ba:X:Cu=1:1.5:0.5:3. Preferably X is Mg.

Preferably the powder has a morphology selected from the group consisting of cigars, spiral, spires, rods, tubes, cylinders, agglomerates and flat "cracker" shaped crystalline agglomerates.

The new morphologies and topological materials made by incorporating elements such as Mg, are not just superconducting above liquid nitrogen but also have demonstrated enhanced properties such as; residual magnetism, Coulomb effects, electrostatic charge carrier, dual magnetic properties of attraction and repelling of normal and other superconducting materials, superior magnetic flux enhancements over previously known superconductors, higher current densities, electromagnetic field amplification and manipulation, superior RF sensitivities and other unusual properties. In particular, they represent new and enhanced materials that are readily usable in paints, inks, emulsions, and 3D printable materials such as SLA, Additive, Sintering and the like. They also provide a new and easily formable powdery material for construction of superconducting or highly insulating wire, powder, for superconducting devices such as superconducting magnetic energy storage (SMES), directed energy conversion (DEC), trapped energy storage (TES), 3D printed particle accelerators and free electron lasers, superconducting electronic components, parts, traces, and the like.

All features described for the other aspects described herein can be freely combined with this aspect. For example, the Mg in the aqueous solution is preferably obtained by dissolving $MgCO_3$ in the at least one mineral acid.

For the past two decades, the addition of nanoscale MgO into high temperature superconductor (HTSC) materials has been explored, where it is postulated to increase the critical current density by flux pinning. The compound $YBa_2Cu_3O_x$ (YBCO) was synthesized by co-precipitation method and recently improved to make superconducting nanorods and nanotubes. The wet chemical method used to make MgO is similar to that for synthesizing YBCO and inherently provides intimate mixing along with a greater control of grain size, while additionally facilitating large-quantity scale-up. In addition, the present invention provides the application of the wet-chemical method to co-precipitate magnesium (Mg), yttrium (Y), barium (Ba) and copper (Cu) to synthesize HTSC powder of the parent composition $YBa_2Cu_3O_x$ with high transition temperature ($T_c$) into interesting morphologies with the parent composition of $YBa_{1.5}Mg_{0.5}Cu_3O_x$.

According to a further aspect there is provided a $LnM_2Cu_3O_x$, or $LnM_{2-y}X_yCu_3O_x$ and/or $Ln_2M_{2-y}X_yCuO_x$ high-temperature superconductive powder, wherein Ln is a rare earth element, preferably Y, Ce, Dy, Er, Gd, La, Nd, Pr, Sm, Sc, Yb, or a mixture of two or more thereof, and wherein M is selected from Ca, Sr, and Ba, preferably wherein Ln in Y and M is Ba, wherein the powder has a morphology selected from the group consisting of cigars, spiral, spires, rods, tubes, cylinders, agglomerates and flat "cracker" shaped crystalline agglomerates. Preferably the morphology is a spiral, as shown in FIG. 13 *e*, also known as a spire. Preferably the powder has a mean crystallite size of from 1 to 15 nm.

The fine grained intimately mixed powder gives high reactivity causing the systematic formation of morphological shapes at temperatures lower than what is conventionally used to form the final HTSC compound.

In the characteristics of the spirals the inventors have observed a mono-layer material having each $YBa_{2-y}Mg_yCu_3O_x$ crystal cell closely packed, uniformly self-assembled in the same direction. Such spirals, given their dimensions, will trap only a single vortex and should have a strong pinning effect. Moreover, it is speculated that superconductivity in such spirals will be much more robust than in uniform nano-rods of the same dimension, simply because the radius is comparable to a coherence length. The order parameter for uniform nano-rods is likely to be strongly suppressed due to fluctuations which will dominate in such small objects. However, a rolled spiral sheet with a large surface area is quite a different matter where the 'in-plane' dimension is orders of magnitude larger than a coherence length and superconducting fluctuations will, as a consequence, be heavily damped. As far as the inventors are aware superconducting spiral sheets have not been discussed in the literature and clearly for a quasi-two-dimensional electronic system such as the cuprates, such spirals will have unusual properties deserving detailed study. A key remaining issue is the coupling between such spirals within the microstructural matrix. If the assembly is strong-linked then the coupling between these spirals seems to be remarkably strong. One would think that, at best, one might hope for coupling comparable to the interlayer coupling along the c-axis (normal to the $CuO_2$ planes) which is observed in bulk material. Anything stronger than this would be a surprise and would point to further highly unusual properties in these unique structures.

Although the compounds are described herein with the amount of O defined by the subscript X, it is also possible for the compounds to be considered as $O_{7-x}$. That is, the maximum value for O is 7, but the amount may be substoichiometric.

The invention will now be described further with reference to the non-limiting figures:

FIG. 1 shows a TEM image of the dried precipitate showing a fine and relatively uniform grain size of less than 10 nm.

Figure 2A:
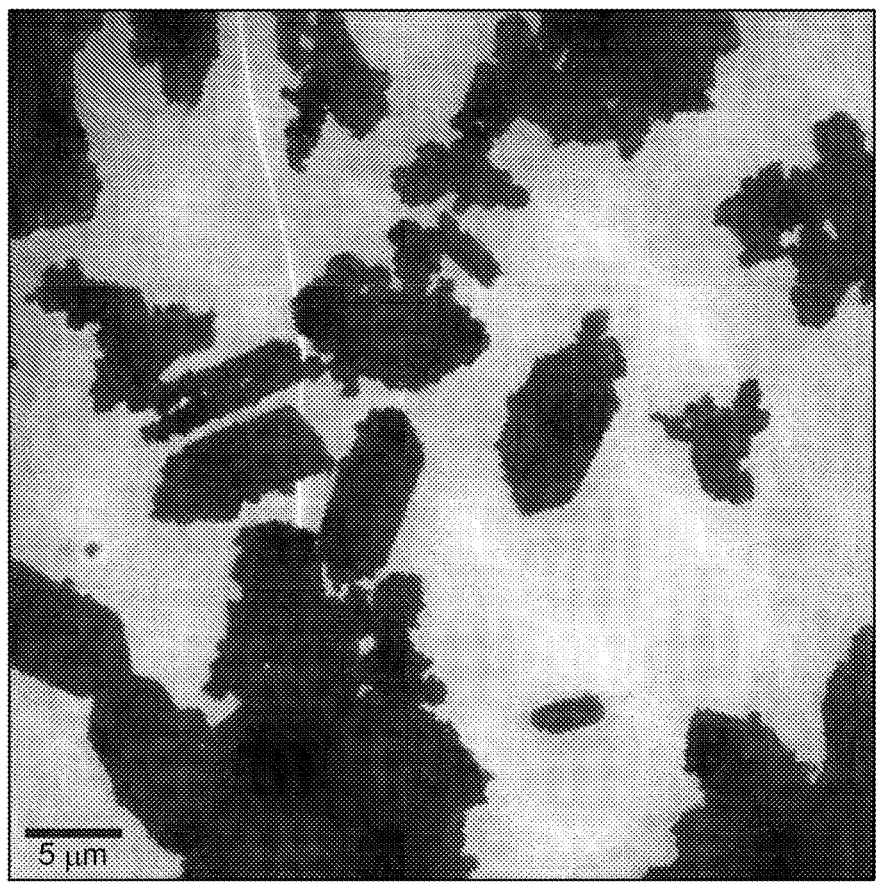
FIGS. 2A-C show TEM images of precursor powder.
Figure 2B:
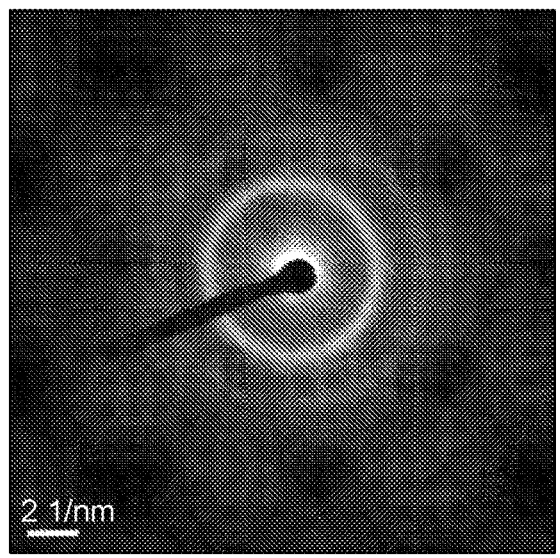
Figure 2C:
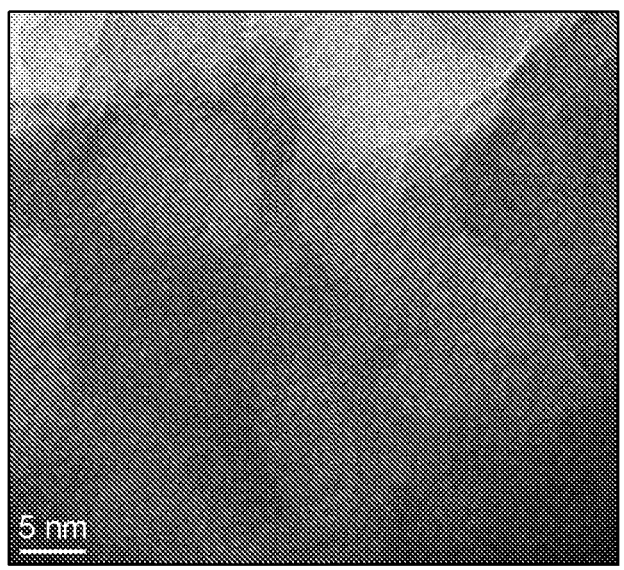

FIGS. 2A-C show TEM images of precursor powder made by calcining the dried precipitate to 500° C. The diffraction pattern shown in 2B and the higher resolution image in 2C confirm the presence of a large amorphous phase and a small amount of crystalline phase.

Figure 3:
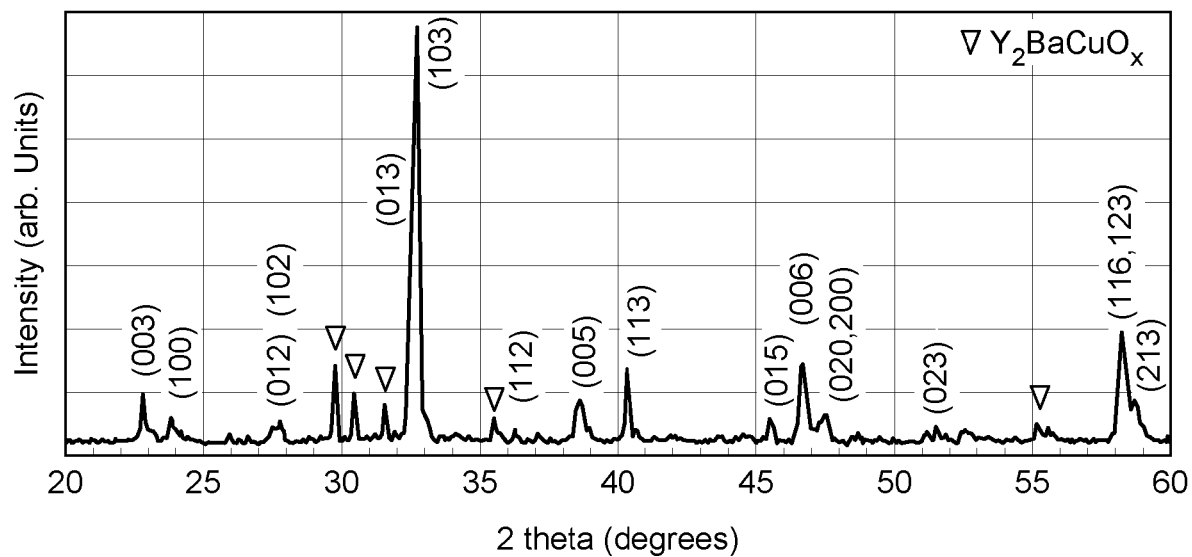
FIG. 3 shows an XRD trace of precursor powder.

FIG. 3 shows an XRD trace of the powder, Sample A, heated to 950° C. in flowing oxygen. Most of the peaks with mirror planes assignment are for the $YBa_2Cu_3O_x$ phase. Peaks, indicated by triangles, of the $Y_2BaCuO_x$ phase are identified indicating a small amount of this phase. Discs pressed from this powder (Sample B), and subsequently sintered at 970° C. in oxygen (Sample C) also showed a similar pattern with reduced $Y_2BaCuO_x$ phase indicating progressed conversion to the $YBa_2Cu_3O_x$ phase.

Figure 4A:
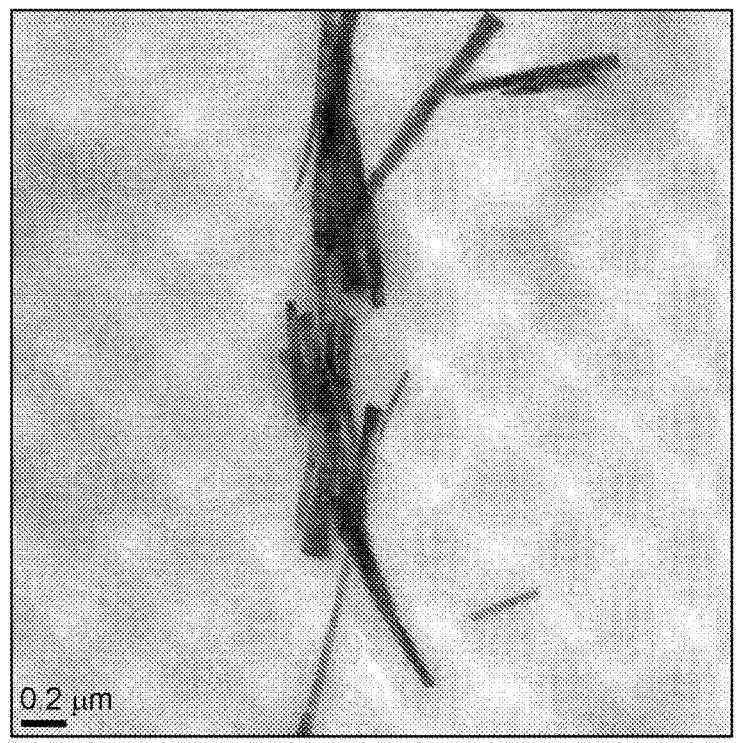
FIGS. 4A and 4B show TEM images obtained on superconducting nanorods.
Figure 4B:
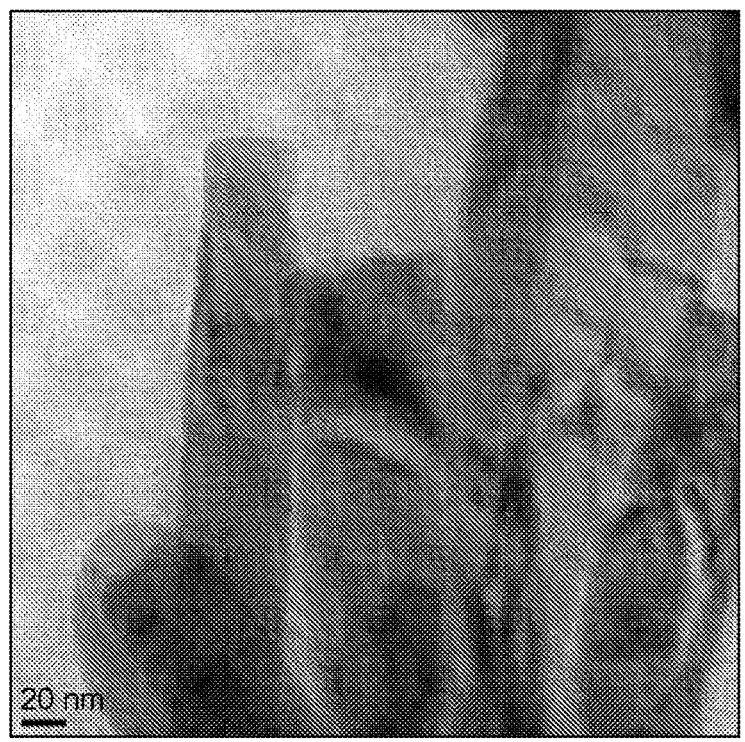

FIGS. 4A and 4B show TEM images obtained on the superconducting nanorods which have been heated to 970° C. in oxygen, Sample A.

Figure 5A:
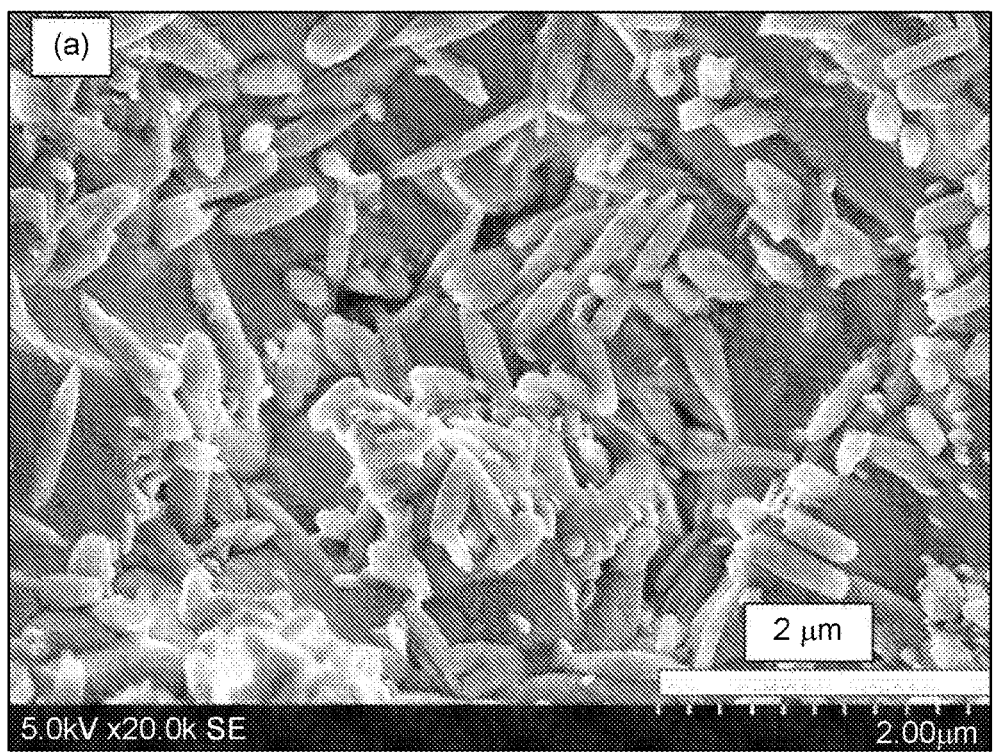
FIGS. 5A-C show SEM images of (a) superconducting powder; (b) a pressed disc; and (c) a sintered disc.
Figure 5B:
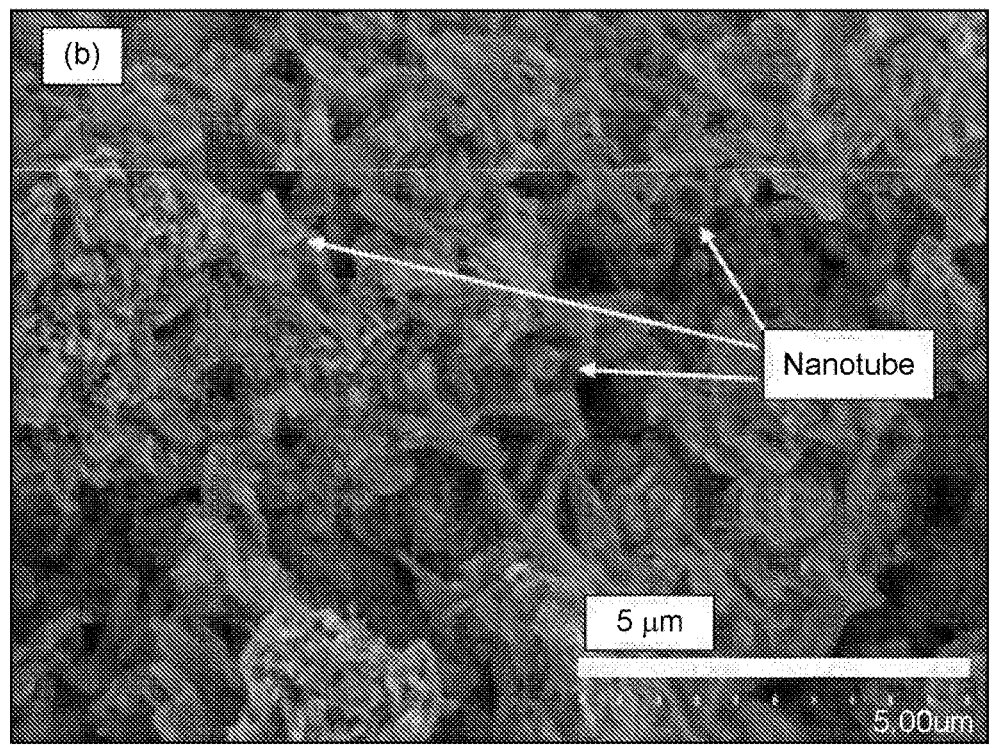
Figure 5C:
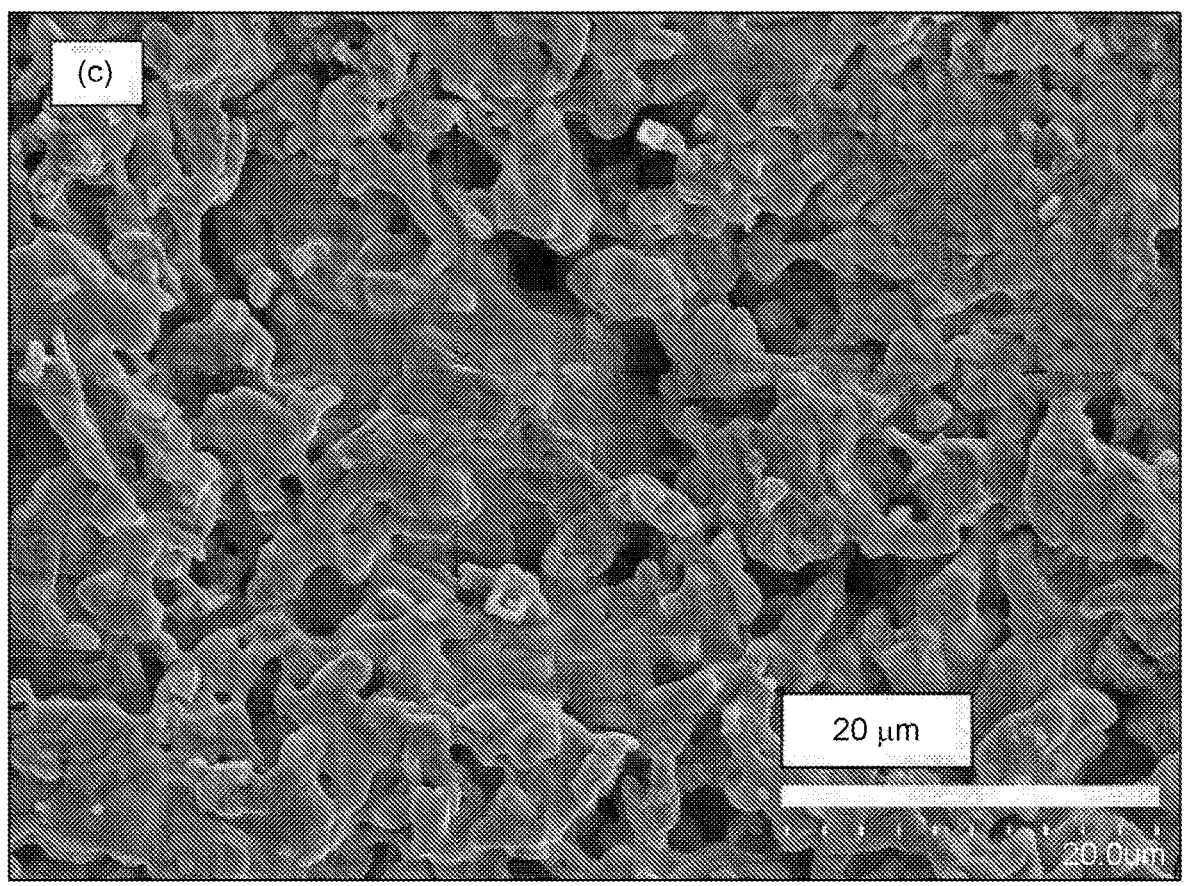

FIGS. 5A-C show SEM images of (a) superconducting powder, Sample A; (b) Pressed disc, Sample B and (c) sintered disc, Sample C. The nanorod clusters can be seen in the image of powder in (a) where the larger crystals in the background are a substrate material and not the superconducting powder. Clear evidence of nanotubes can be seen in the pressed disc (b) and arrows have been placed to highlight some of these nanotubes.

Figure 6A:
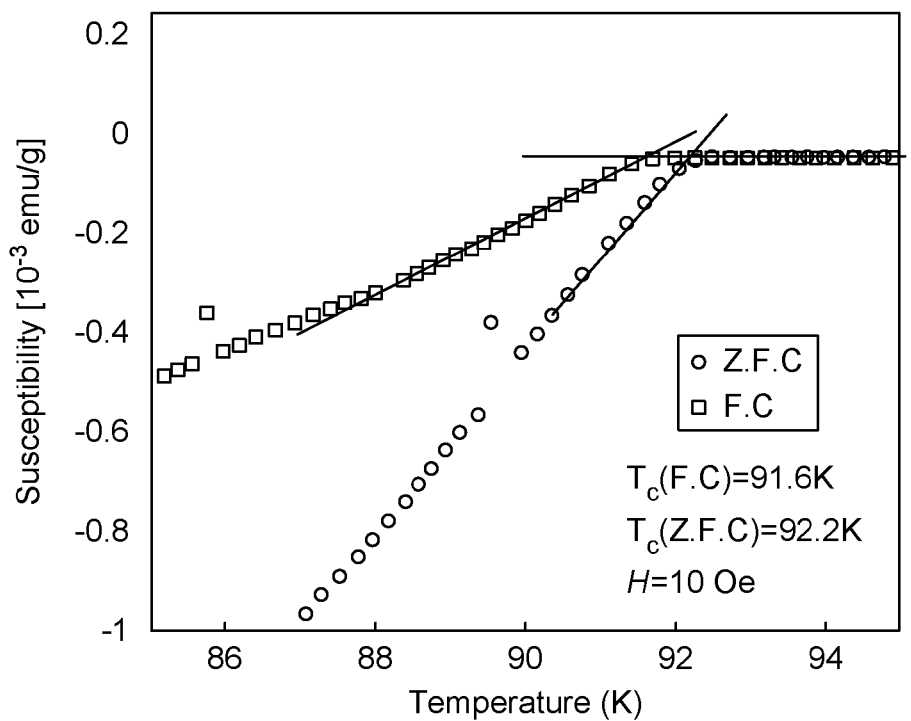
FIGS. 6A-C show DC magnetization measurements showing superconducting transition in samples.
Figure 6B:
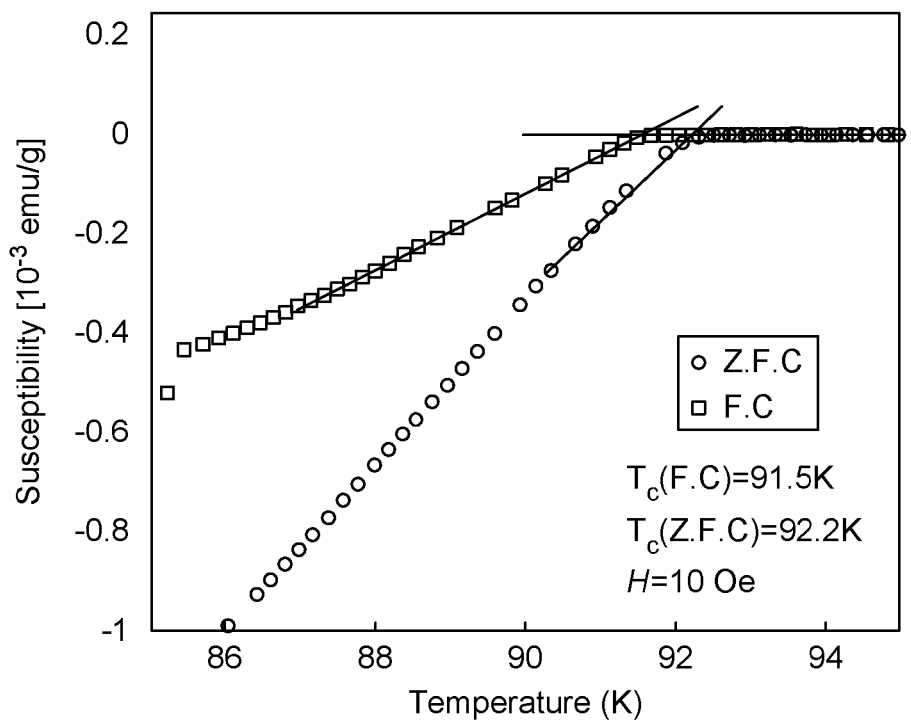
Figure 6C:
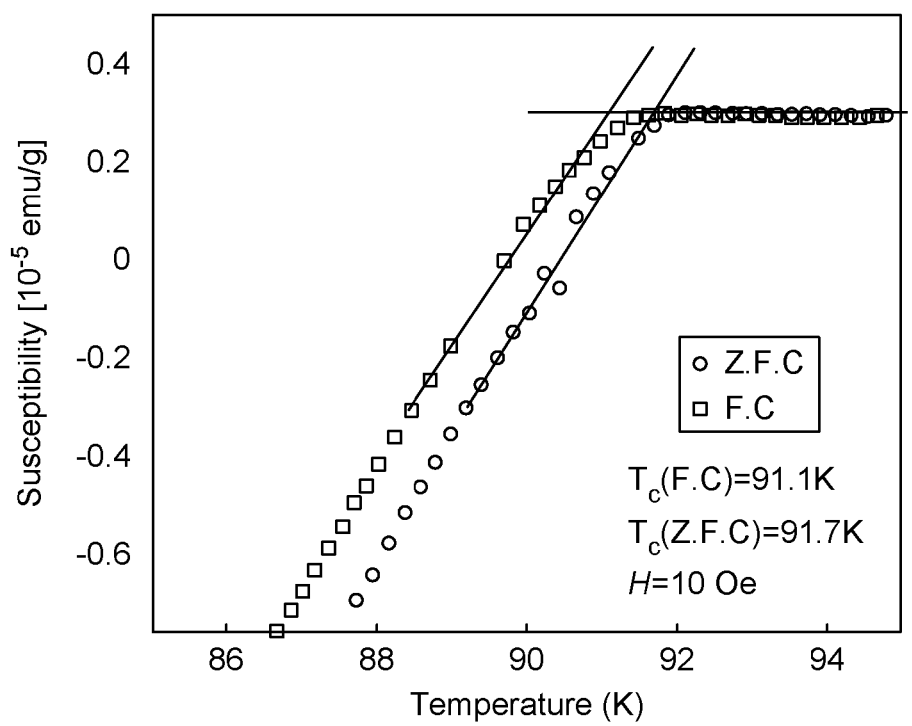

FIGS. 6A-C show DC magnetization measurements showing superconducting transition in each of the samples (a) $YBa_2Cu_3O_x$ powder, Sample A (b) $YBa_2Cu_3O_x$ powder pressed into a disc, Sample B and (c) $YBa_2Cu_3O_x$ pressed disc sintered at 970° C. in oxygen, Sample C. The Field Cooled (FC) and the Zero Field Cooled (ZFC) data are clear indication of Type (II) superconductivity consistent with $YBa_2Cu_3O_x$. In both FIGS. 6A and 6B the F.C. line intersects the y axis at about −0.5, whereas the Z.F.C line intersects the x axis at around 86/87 K. In FIG. 6C, the F.C. line intersects the x-axis at about 87K and the Z.F.C intersects the x axis at about 88K.

Figure 7:
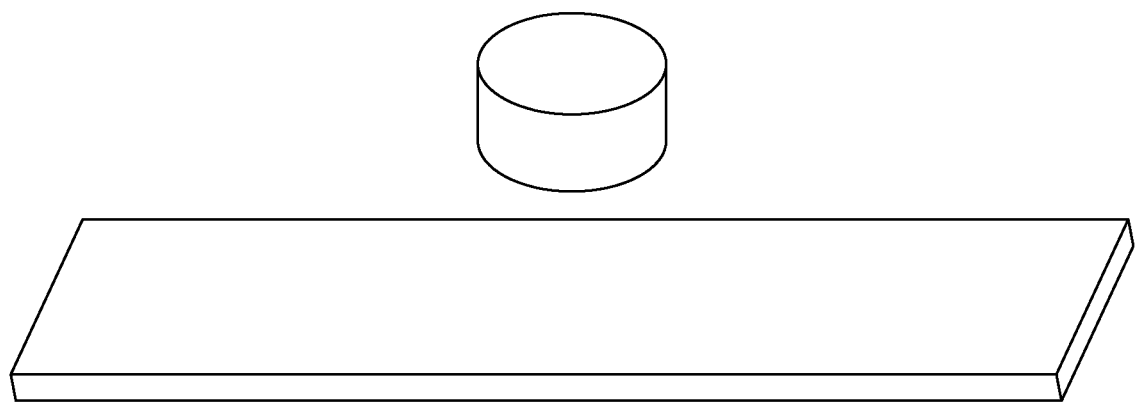
FIG. 7 shows a sketch of a copper tube air spray coated with superconducting powder showing evidence of Meissner effect.

FIG. 7 shows a sketch of a copper tube air spray coated with superconducting powder showing evidence of Meissner effect. No subsequent heat treatment was carried out.

Figure 8:
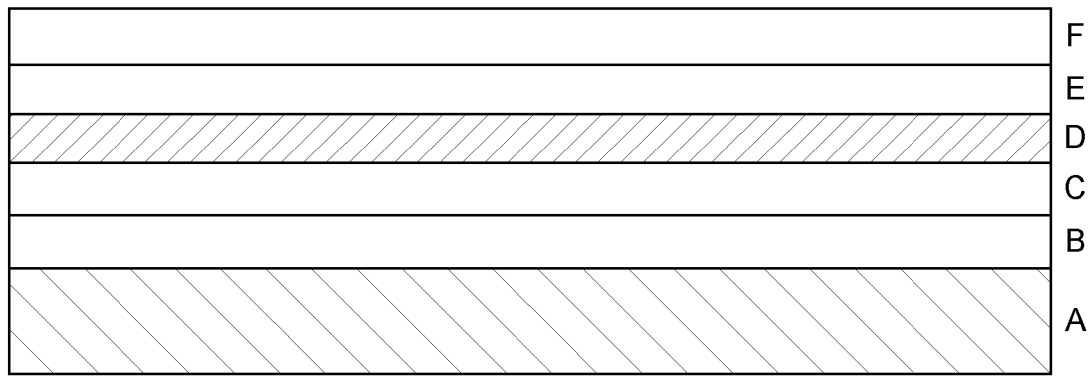
FIG. 8 shows a multilayer painted film showing the various layers.

FIG. 8 shows the multilayer painted film showing the various layers: A=substrate, B=primer, C=insulating later, D=superconducting paint, E=insulating layer and F=barrier layer.

Figure 9:
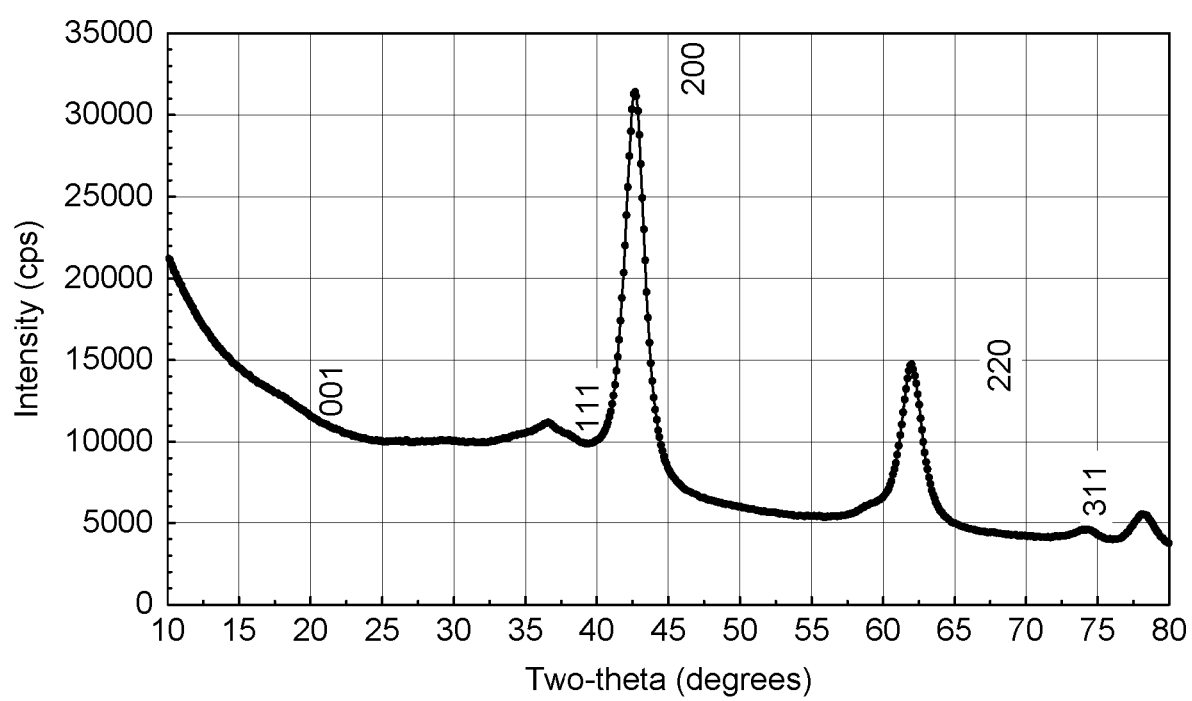
FIG. 9 is an XRD graph of MgO calcined powder.

FIG. 9 is an XRD graph of MgO powder calcined at 500° C. for 2 h. Miller indices are assigned according to published values.

Figure 10A:
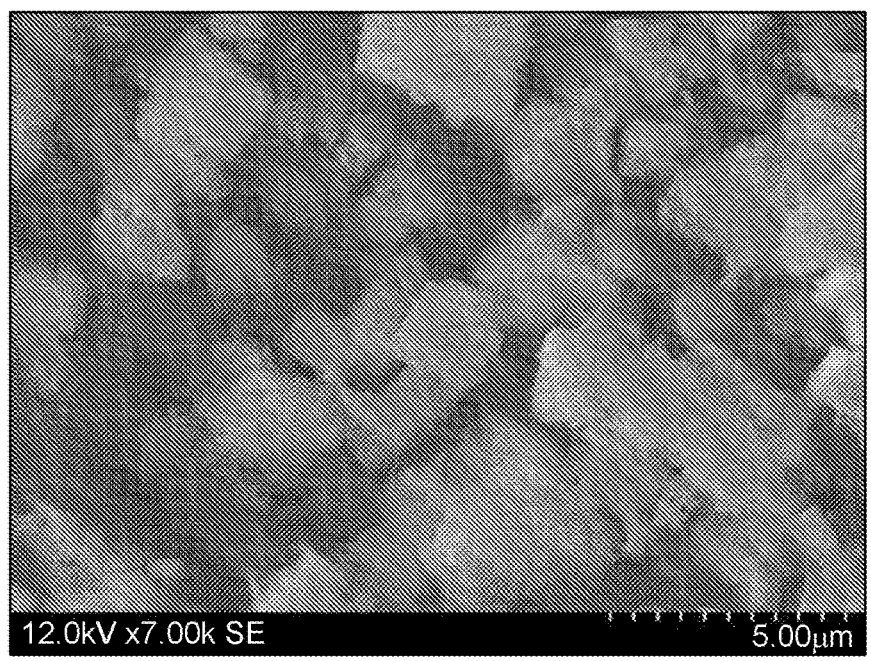
FIG. 10A is an electron microscope image of calcined MgO powder.

FIG. 10A is an electron microscope image of the MgO powder calcined 500° C. for 2 h, assessed using SEM.

Figure 10B:
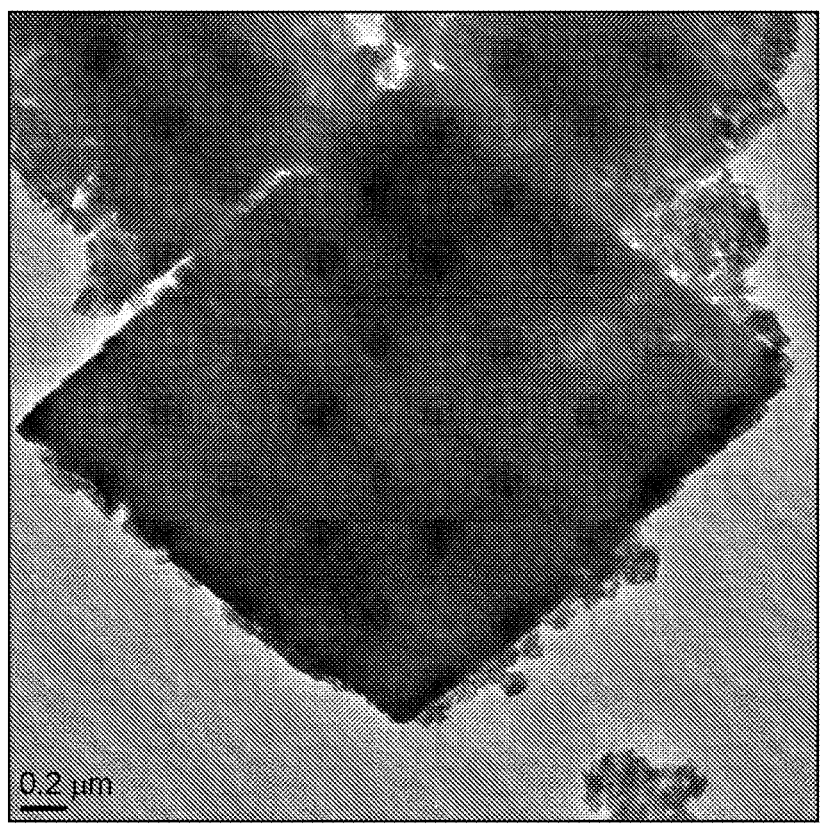
FIG. 10B is an electron microscope image of calcined MgO powder.

FIG. 10B is an electron microscope image of the MgO powder calcined 500° C. for 2 h, assessed using TEM showing cubic morphology.

Figure 11A:
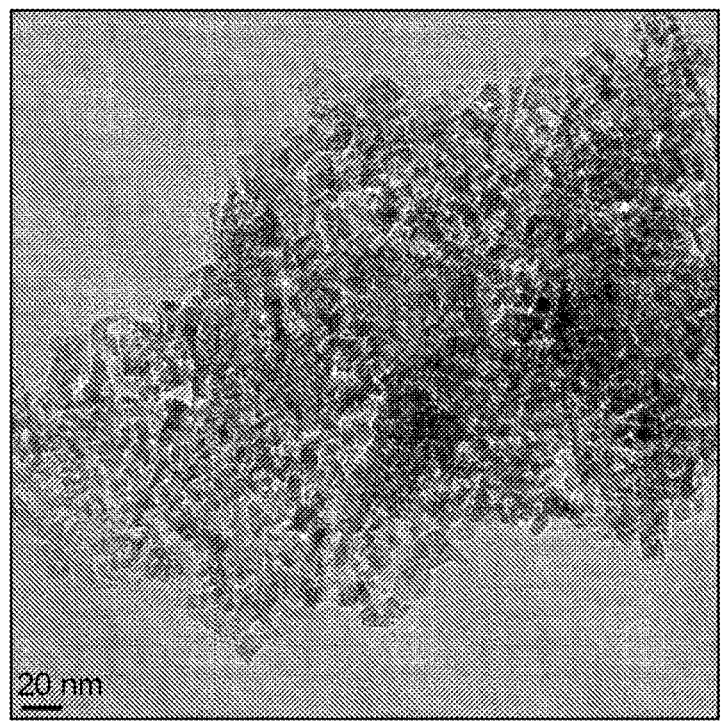
FIG. 11A is a TEM image of calcined MgO powder.

FIG. 11A is a TEM image of the MgO powder calcined at 1000° C. for 2h showing crystal size of less than 10 nm consistent with the estimated XRD crystallite size.

Figure 11B:
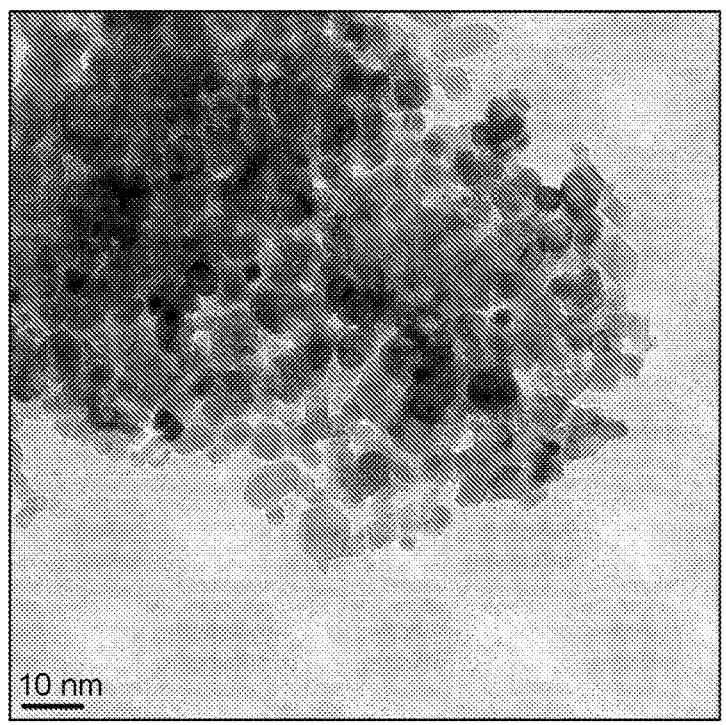
FIG. 11B is a TEM image of the calcined MgO powder.

FIG. 11B is a TEM image of the powder made by calcining $MgCO_3$ at 1000° C. for 2 h, and shows larger crystals.

Figure 12:
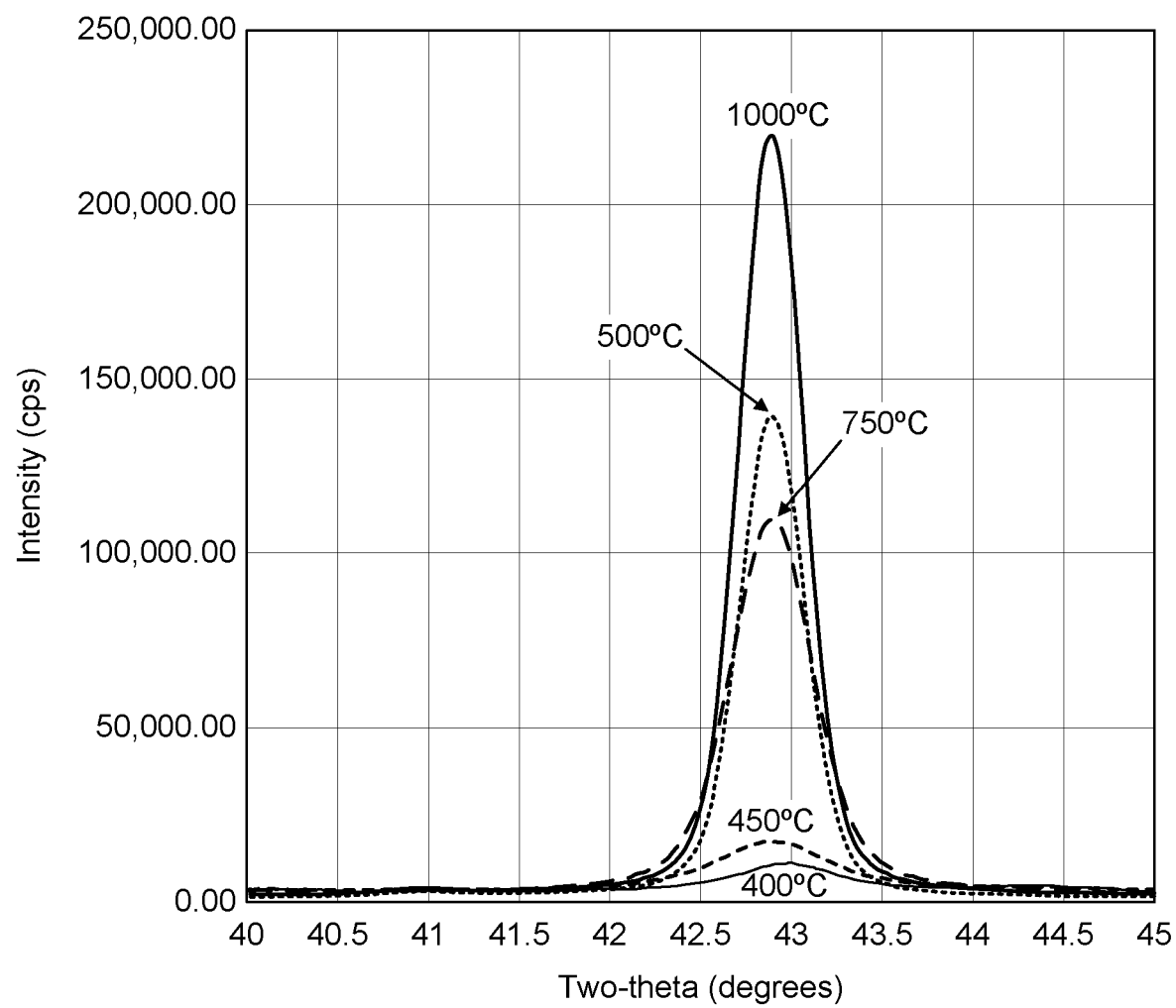
FIG. 12 is an XRD [211] pattern of calcined MgO powder.
Figure 13A:
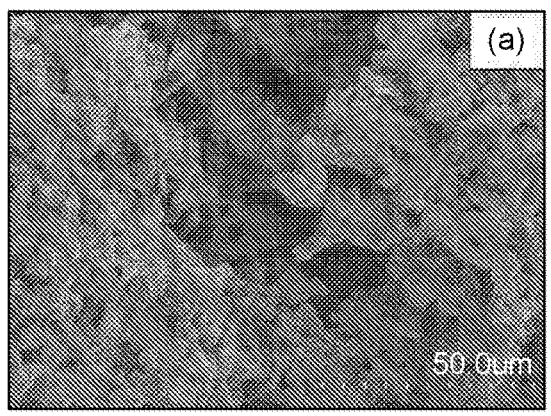
FIG. 13 shows SEM images of powder.
Figure 13B:
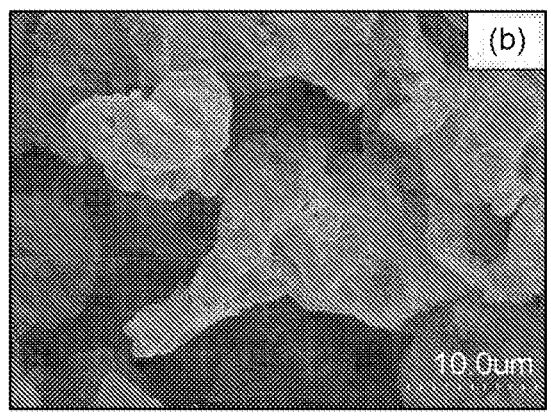
Figure 13C:
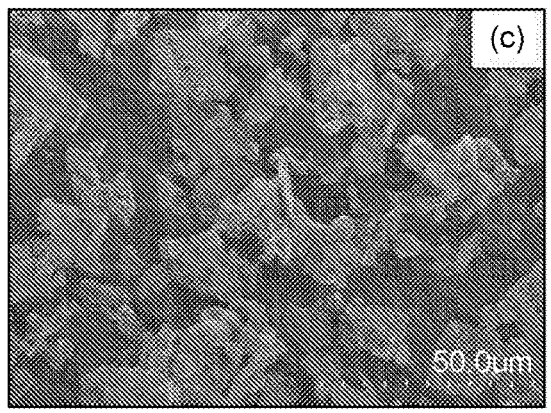
Figure 13D:
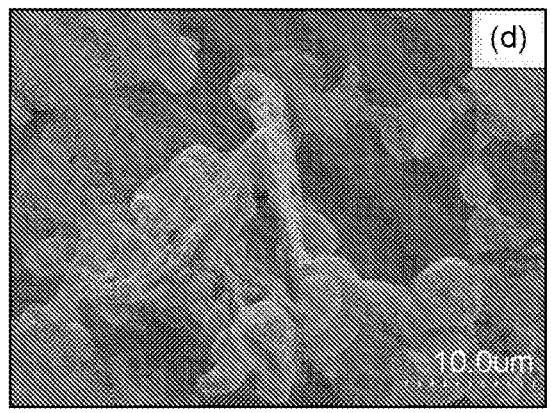
Figure 13E:
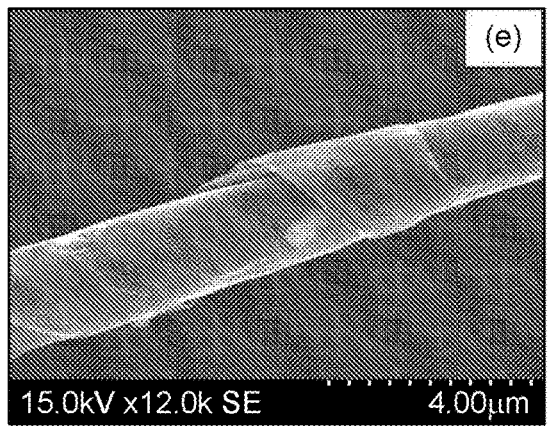
Figure 13F:
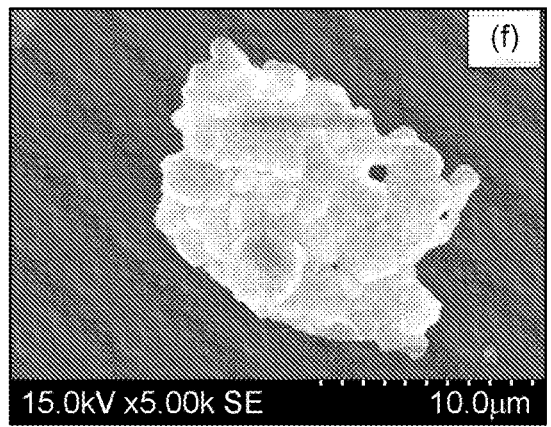

FIG. 12 is an XRD [211] pattern of MgO powder, made by calcination at various temperatures 400° C. to 1000° C., labelled appropriately in the figure.

FIG. 13 shows SEM images. Figures (a) and (b) show the parent $YBa_2Cu_3O_x$ powder treated at 970° C. for 12 hrs in oxygen compared to the powder made by adding Mg during the precipitation process and heated in the same manner in (c) and (d). Some of the grains of the YBCO—Mg powder curl up into structures shown in (e) while others are quite distinct as the image shown in (f). EDS analysis of the grain shown in FIG. 13 (*d*) and FIG. 13 (*e*) shows a Y:Ba:Cu ratio close to 1:2:3 and in FIG. 13 (f) close to 2:1:1. The morphology of the FIG. 13 (f) grain is similar that reported for $Y_2BaCuO_5$.

Figure 14A:
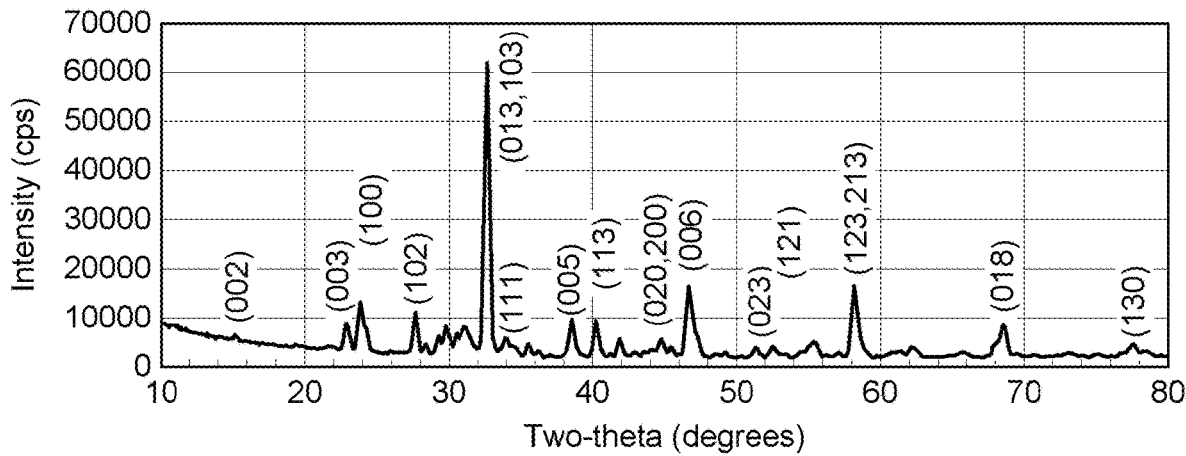
FIG. 14 shows XRD patterns.
Figure 14B:
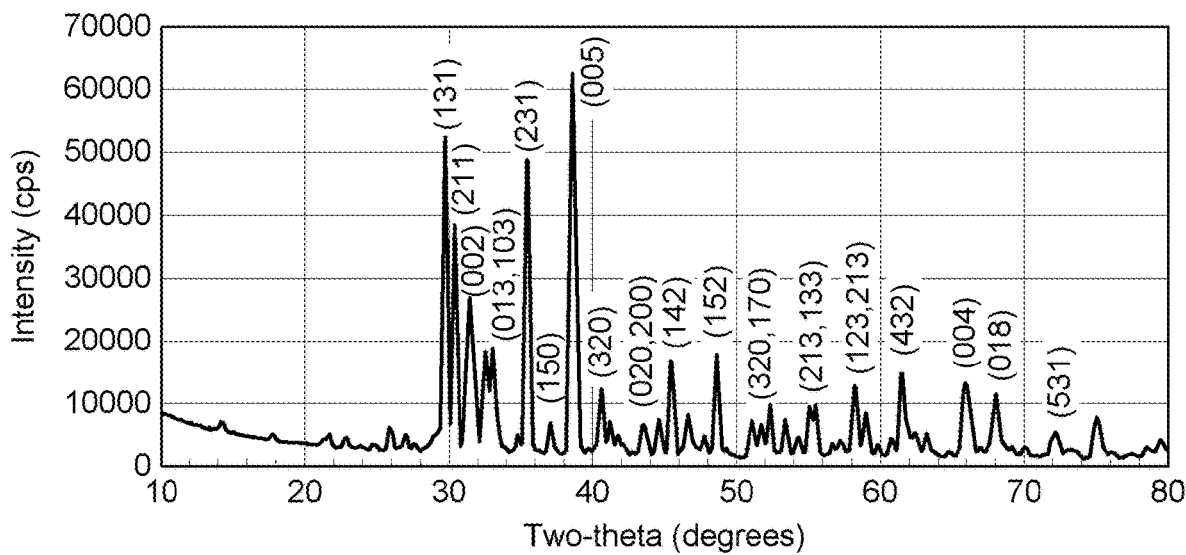

FIG. 14 shows XRD pattern of the (a) parent $YBa_2Cu_3O_x$ and (b) $YBa_2Cu_3O_x$ with Mg. There is considerable distortion of the phase composition. Miller indices of the $YBa_2Cu_3O_x$ phase are marked, while the other phases are predominantly $Y_2BaCuO_5$. The Miller Indices in red ((013, 103)(005)(020, 200)(123, 213)(018)) in FIG. 14 (b) are for the $YBa_2Cu_3O_x$ phase while in black (the rest) are for the $Y_2BaCuO_5$ phase.

Figure 15A:
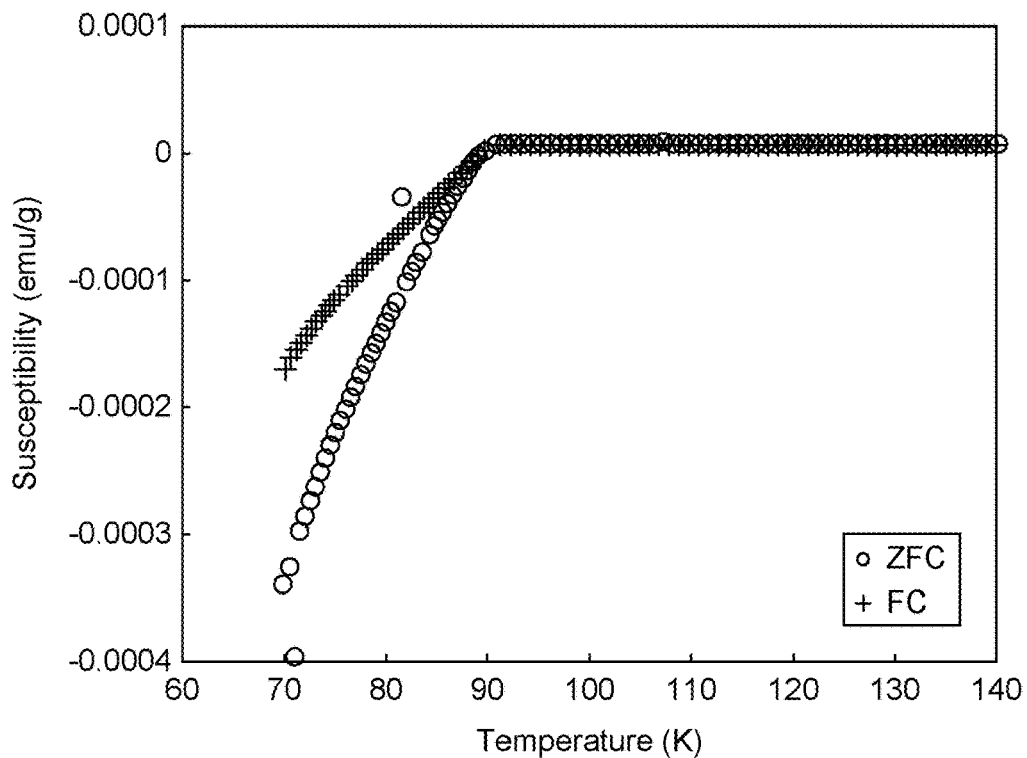
FIG. 15 shows two plots of DC magnetization measurements.
Figure 15B:
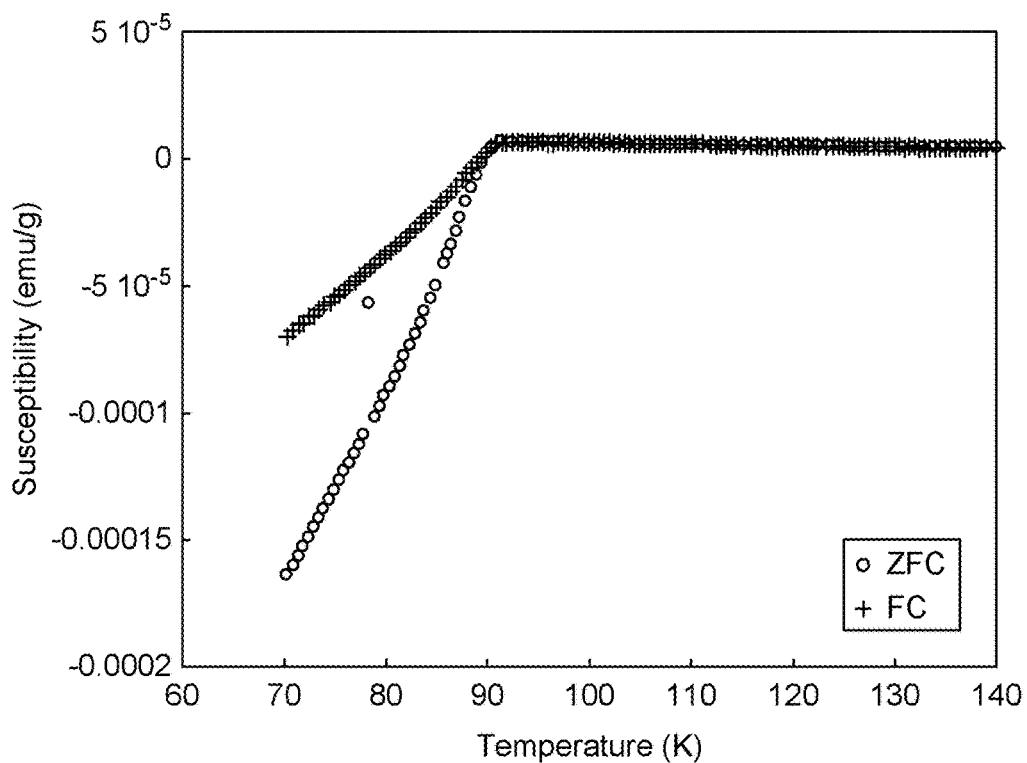

FIG. 15 shows two plots of DC magnetization measurements on (a) the parent $YBa_2Cu_3O_x$ powder, S1, and the $YBa_2Cu_3O_x$ powder with $Mg^{2+}$, S2. The Field Cooled (FC) and the Zero Field Cooled (ZFC) data are clear indication of Type (II) superconductivity consistent with $YBa_2Cu_3O_x$.

Figure 16:
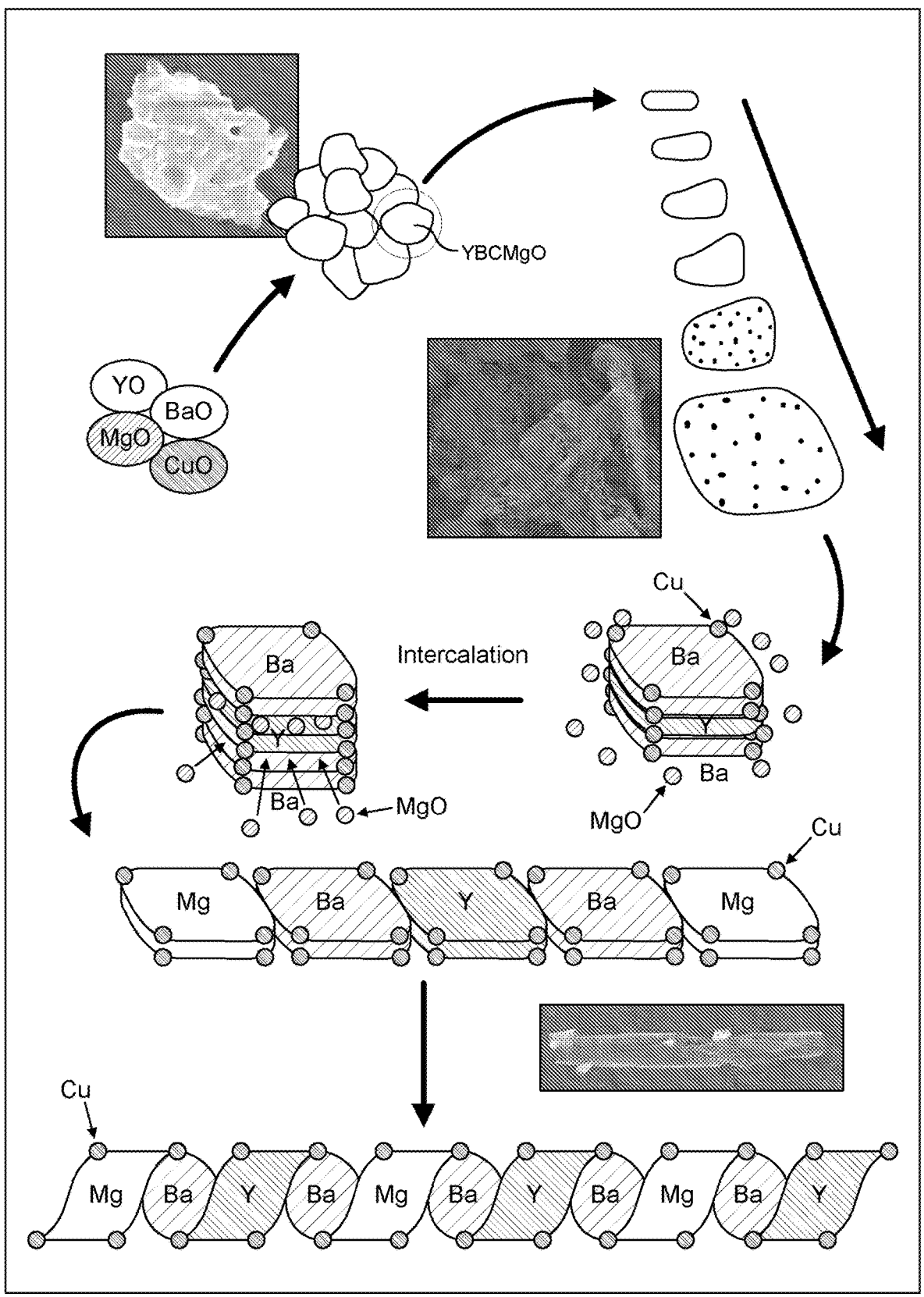
FIG. 16 shows a schematic depiction of formation of YBCO.

FIG. 16 shows the understood formation of YBCO molecules into a multi-crystal agglomerate that when heated transforms into the cracker-like morphology due to the influence of the MgO presence. Upon further heating, the cracker-like morphology is intercalated and unfolded into a 2-dimensional topology, eventually curling into a spiral morphology.

Figure 17:
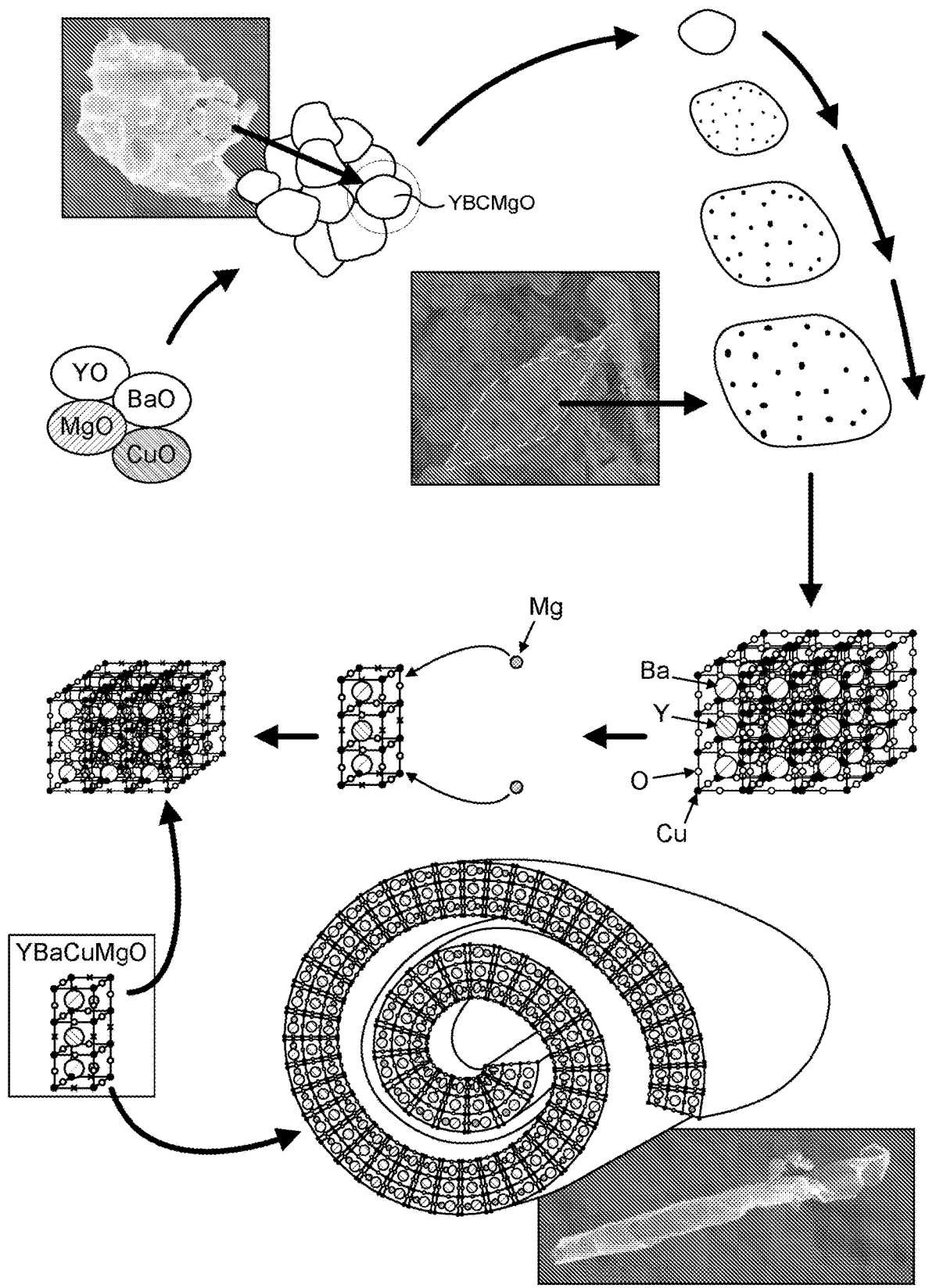
FIG. 17 shows a schematic depiction of formation of YBCO molecules into a multi-crystal agglomerate.

FIG. 17 shows the understood formation of YBCO molecules into a multi-crystal agglomerate that when heated transforms into the cracker-like morphology due to the influence of the MgO presence. Upon further heating, the cracker-like morphology is intercalated and unfolded into a 2-dimensional topology, eventually curling into a spiral morphology.

EXAMPLES

The present invention will now be described in relation to the following non-limiting examples.

To form the samples which form the basis of the Figures, high purity $Y_2O_3$, $BaCO_3$ and CuO powders as well as ethyl acetate, butyl acetate and ethanol were purchased from Nacalai Tesque, and dissolved in dilute nitric, hydrochloric acid or sulphuric acid to a clear solution. Precipitation was brought about by adding oxalic acid, ammonium oxalate, citric acid or ammonia solution. The size of the precipitated grains was controlled by carefully monitoring precipitation to allow a slow rate of precipitation. A dispersant was preferably added prior to filtration to keep the precipitate from coagulating. The precipitate was then dried at 100° C., calcined at 500° C. in air and heated to 950° C. in flowing oxygen to obtain powder, Sample A, of the $YBa_2Cu_3O_x$ phase. The powder was pressed into discs. Some discs were retained, Sample B, while others were sintered, Sample C at 970° C. in flowing oxygen.

The samples were examined by powder X-ray diffraction, being performed by a conventional X-ray spectrometer with a graphite monochromator (RINT-1100 RIGAKU) and the intensity data were collected with CuKα radiation over a 2θ range from 10° to 80° at 0.02° step width.

A Hitachi SU9000 Field Emission Scanning Electron Microscope (SEM) and JEOL 6600 SEM was used to examine the morphology of all specimens and Transmission Electron Microscopy (TEM) was conducted using a JEOL JEM 2200 FS Microscope.

The superconducting properties of the powder specimens were determined through DC magnetization measurements. Magnetic susceptibility was performed with a MPMSR2 Quantum Design SQUID magnetometer at 10.0 Oe in an atmosphere of 77.8% Helium from 4K to 150 K at 10 K/minute.

The precipitate formed by the wet chemical method was dried in air and examined by TEM shown in FIG. 1(a). The precipitate is of extremely fine grained, less than 10 nm, mix of components. The process to make nanorods from this precipitate was achieved in two main stages. In the first stage, the dried precipitate was calcined in air at 500° C. in a muffle furnace for 4 h to achieve a precursor (which was subsequently used to prepare Sample A). The precursor powder was an intimate mix of Y, Ba and Cu compounds, with most crystals in size of about 10 nm (see FIG. 2A, where the growth of nanorods can be seen to have commenced even in this preliminary stage).

In the second stage the precursor is heated to 950° C. on a quartz boat in a tube furnace for 12 h in flowing oxygen where the precursor compounds combine to form the $Y_1Ba_2Cu_3O_x$ phase. This reacted powder is called Sample A. TEM examination of Sample A showed that most crystals are about 5 nm in size. For further study, two sets of discs were prepared with Sample A of the $Y_1Ba_2Cu_3O_x$ composition. One sample is retained as pressed disc and is called Sample B, while the other was further sintered in a tube furnace at 970° C. in flowing oxygen and is called Sample C.

Sample A was formed at 950° C. in flowing oxygen, Sample A, shows a dark black colour indicative of the $YBa_2Cu_3O_x$ phase. Intense examination occasionally showed a few specks of green colour due to the presence of a small amount of the $Y_2BaCuO_x$ phase. The XRD trace of Sample A is shown in FIG. 3 which confirms the visual observations.

Being placed into an open air Styrofoam boat Sample A was immersed in liquid nitrogen. It demonstrated magnetic levitation over Halbach array and other magnetic arrangements indicating Sample A has formed a superconducting state at temperatures at or above liquid nitrogen.

An interesting morphology is seen in Sample A TEM images (FIG. 4A-C). The principal shape is a nanorod with length of over 100 nm and width as small as 20 nm. The superconducting Sample A powder was pressed into two discs, of which one was subsequently sintered to 970° C. in flowing oxygen. The surface of these discs were examined by SEM to see the effect of pressing and sintering on morphology and properties of the powder. FIG. 5A-C show the SEM images of the pressed disc and sintered disc. On pressing, the nanorods largely retain their shapes, while on sintering the nanorods sinter as expected fusing along edges with other grains. Of particular interest is that some of the nanorods coil upon sintering. Without wishing to be bound by theory, it is believed that the careful control of pH and precipitation rates assist in the formation of nanorods. By further heat treatment of nanorods between temperatures of about 925° C. to 1000° C. and times of between 5 h to 48 h, the structures grew into nanotubes. In one example, the powder, already shaped into nanorods, can be heat treated to 967° C. for 16 h and the nanorods shapes begin to transform into nanotubes. A constant flow of oxygen is needed to ensure the product is superconducting at temperatures above liquid nitrogen.

Superconducting magnetic properties of the powder, pressed disc and sintered disc are shown in FIG. 6, which clearly indicate a superconducting transition temperature of about 92 K in each of the sample. Of particular note is the result that the powder, Sample A, pressed disc, Sample B, and sintered disc, Sample C, are all superconducting confirming the earlier observation of the Meissner effect in each case.

As early as 1990, Ferrando highlighted the significance of making superconducting paint for a range of applications including SQUID, shielding devices and waveguides. However the applied film then required sintering to 900° C. in order to make it superconducting. A similar method was developed by Shi and Qiu requiring post deposition sintering to nearly 1000° C. to make the film superconducting. The significance of the findings described herein is that Sample A in powder form as synthesized is superconducting and can be applied to fabricate any substrate, flexible or otherwise, and a superconducting product could be made without the need for post sintering or oxygenation, thereby preserving the state of the substrate and the film. A paint was made with superconductor powder using three equal parts of ethyl acetate, butyl acetate and ethanol. The paint was applied on copper surface by air-spray brush and allowed to dry. No subsequent heat treatment was necessary to achieve superconductivity.

FIG. 7 is a diagram showing a test where a coated surface levitated providing clear evidence of Meissner effect indicates that the film has retained its superconducting property.

FIG. 8 shows the layers used in an example to make a superconducting film. In this example, we have used well known primers such as alcohol based synthetic resin or epoxy, an insulating layer made from well know compounds such as MgO or $Al_2O_3$, the superconducting paint layer, followed by another insulating layer and finally an atmospheric barrier, which is a polymer material like rubber or plastic or epoxy.

In conclusion, nanorods of $Y_1Ba_2Cu_3O_x$ have been synthesized which are shown to be superconducting by levitation and by magnetic measurements. A simple and commercially viable process of wet chemistry has been used to manufacture the nanorods, which are generally difficult to manufacture in large amounts for any material and are unknown for $Y_1Ba_2Cu_3O_x$ material in this way. Once shaped and suitably oxygenated, the nanorods retain their morphology to an extent and maintain their superconductivity with a transition temperature of about 92 K.

ADDITIONAL EXAMPLES

These additional examples focus on MgO powder with nanometer size crystals which was synthesized by a novel wet-chemical method. This powder has a crystallite size of about 5 nm to 20 nm depending upon calcination temperature and time, and a high surface reactivity, causing the sub-nanoscale powder to agglomerate into cubic structures. Co-precipitation of Y, Ba, Cu and Mg resulted in a high temperature superconductor with a $T_c$ of about 90 K and a unique plate-like structure. Research indicates that $Mg^{2+}$ are intimately and homogenously distributed within the $YBa_2Cu_3O_x$ structure forming unique morphologies.

Nanoscale MgO: The process to make nanoscale MgO begins by dissolving 99.99% magnesium carbonate ($MgCO_3$) from Nacalai Tesque in reagent grade 1M nitric acid making a clear solution containing $Mg^{2+}$. A mixture of oxalic acid, ammonium oxalate, gelling agent, catalyst, and a dispersion agent was then used to precipitate gelatinous magnesium oxalate. The precipitate was dried at 110° C. overnight and subsequently calcined to 500° C. for 2 h to obtain MgO powder. The final powder prepared flowed like a liquid and took on a fluid like concave meniscus when poured into a glass jar. To study the effect of temperature and time, a range of samples were prepared from the parent precipitate and calcined at various temperatures and time shown in Table 1. For comparison to a traditional process, the commercially available $MgCO_3$ was separately calcined to 1000° C. in air for 5 h to form MgO.

Nanoscale $YBa_{1.5}Mg_{0.5}Cu_3O_x$: The process to synthesize the superconducting YBCO powder by wet chemistry is described above and shown here as sample S1. We now combine the process to make nanoscale MgO with that to make fine grained YBCO powder. Briefly, 99.9% pure $Y_2O_3$, $BaCO_3$, $MgCO_3$ and CuO powders purchased from Nacalai Tesque were dissolved in 0.5 M dilute nitric acid forming a clear solution in the stoichiometric ratio Y:Ba:Mg:Cu=1:2:0.5:3. Precipitation was achieved by slowly adding 1 M solution of oxalic acid until no further precipitation was observed. About 30% excess oxalic acid by volume was required to fully precipitate the cations. The precipitate is dried at 110° C. and is calcined first at 500° C. in air followed by heat treatment at 970° C. for 12 h in flowing oxygen to form the YBCO powder containing magnesium, sample S2.

XRD analysis of the powder was carried out using a Rigaku RINT-TTR III/NM diffractometer using a Cu $K\alpha$ radiation. The crystallite size, D, of the MgO powder was determined using the Scherrer equation:

$$D = \frac{K\lambda}{\beta \cos\theta},$$

where $\lambda$=wavelength used=0.154 nm, $\theta$=Bragg angle in degrees, K=0.88 and $\beta$=FWHM of the particular reflection in radians after correction for instrument broadening [6, 24, 25, 26, 27, 28]. A Hitachi SU9000 Field Emission Scanning Electron Microscope (SEM) was used to examine the morphology of the powder. Transmission Electron Microscopy (TEM) was conducted using a JEOL JEM 2200 FS Microscope. The superconducting properties of the powder S1 and S2 were determined through DC magnetization measurements. Magnetic susceptibility was measured with an MPMSR2 Quantum Design SQUID magnetometer at 10.0 Oe in an atmosphere of 77.8% helium from 150 K at 10 K $min^{-1}$.

Results and Discussion

FIG. 9 shows the XRD graph of the MgO powder formed at 500° C. after 2 h of calcining, sample M1, and is a pattern characteristic of powder magnesium oxide. Clear evidence of peak broadening is visible indicating a small crystallite size. The most defined peaks in the XRD pattern are the [200], [220] and [222]. The Scherrer crystallite sizes determined for these three peaks are 5.01 nm, 5.27 nm and 6.99 nm respectively as shown in Table 1(a). Thus, based on the results of powder XRD, it could be stated that the average crystallite size of the powder calcined at 500° C. is from 5 nm to 7 nm. However, we note that the Scherrer crystallite size is generally more useful in comparing powder made by similar processes but has its limitations in determination of the absolute crystallite size.

In order to study the effect of temperature and time on MgO powder, the precipitate, is heated to 450° C., 500° C., 750° C. and 1000° C. for 5 h, called samples M2, M3, M4 and M5 respectively. For comparison, the parent ingredient $MgCO_3$ is directly heated to 1000° C. for 5 h to form MgO, called sample M6. The FWHM on the [200] reflection is shown in Table 1(b), while a comparative XRD in FIG. 14. The mean crystallite size is about 12 nm to 20 nm under the conditions described here which compares well with studies based on the more intricate and small scale sol-gel synthesis. As expected, the Scherrer crystallite sizes generally increase with calcining temperatures. However, comparing results of Table 2(a) and Table 2 (b), it can be said that there is a bigger effect of calcination time on crystallite size than there is of calcining temperature, which is consistent with published findings. XRD patterns become sharper with increasing temperature due to the formation of polycrystals, but there is no observable change in SEM images.

The nanoscale MgO powder reported here has a high surface reactivity and surface energy, coalescing lightly into cubic morphology replicating the established cubic crystal structure of MgO as illustrated by the SEM image in FIG. 10 (a). The higher magnification achieved in TEM image of FIG. 10 (b) show the larger cubic structures have coalesced to form larger grains of the same cubic morphology. However, much smaller grains can be seen on the edges which agglomerate into the larger cubic structures presumably due to their high surface tension and surface energy and electrostatic energy from the TEM tip. Further analysis at higher magnification of the periphery of the cubic structures show some of the sub-nanometer powder which agglomerate to make up the larger cubic structures. Multiple images were collected on the same sample at different angles of tilt with respect to each other. The similarity in the images despite the tilt shows that the powder structures are in fact 3-dimensional cubes. SEM images of samples M1 to M5 showed little change in morphology consistent with the expectations based on literature publications. However, the MgO powder made by calcining $MgCO_3$ directly to 1000° C. has a coarser grain size compared to our process as demonstrated by the SEM image, FIG. 11 (b). These results confirm that the MgO molecular powder we have synthesized is significantly smaller in size than that traditionally obtained and does not increase in crystallite size with increased temperature but does so when heated for longer time. Therefore, it is possible to control the crystal size of the MgO powder by a judicious use of temperature and time.

The control of crystal size and surface area is important for most applications including catalytic, toxicology, superconductor and electrochemical applications. The findings of the research presented here shows that the fine grained, less than 20 nm sized MgO powder can be obtained by wet chemistry which maintains its size up to 1000° C. The use of nanoscale MgO is also important in HTSC materials where an increased flux pinning has been reported by several authors. In these prior studies, the HTSC powder is formed first and then mixed with nanoscale MgO. In the research reported in this manuscript, we precipitate $Mg^{2+}$ ions at the same time as $Y^{3+}$, $Ba^{2+}$ and $Cu^{2+}$ ions, thereby achieving intimate mixing of cations. At the same time, the $Mg^{2+}$ ions were expected to make significant impact on properties and morphology of the parent YBCO powder. FIG. 13 shows a series of images obtained on YBCO powder with and without the addition of $Mg^{2+}$. Significant changes to morphology can be seen with novel shapes such as a high aspect-ratio "cracker" in FIGS. 13 (c) and (d) which are quite distinct to the powder made without $Mg^{2+}$, FIGS. 13 (a) and (b). The "cracker" shape seems to either roll into a morphology shaped like a cigar, FIG. 13 (e) or agglomerate into a crystal, FIG. 13 (f). FIG. 14 are XRD patterns of the YBCO powder without $Mg^{2+}$ addition, S1, and with $Mg^{2+}$ addition, S2. While the XRD pattern shows in FIG. 14 (a) shows a relatively pure phase $YBa_2Cu_3O_x$, the addition of $Mg^{2+}$ ions have significantly altered the phase composition of the powder. While the $YBa_2Cu_3O_x$ can still be seen, the majority phase is the $Y_2BaCuO_5$ compound. The presence of such large amount of the $Y_2BaCuO_5$ phase would be expected to result in an insulating powder. However, DC magnetisation studies, shown in FIG. 7, show that the bulk of the powder S2, is in fact superconducting with a $T_c$ of about 90 K, the same as that for sample S1 which is relatively pure $YBa_2Cu_3O_x$ powder. Further, the EDS spectra on all shapes in sample S2, confirm that the $Mg^{2+}$ are intimately and uniformly mixed within the structure, and no MgO peaks can be seen in the XRD pattern of sample S2.

Hence, novel HTSC compositions $YBa_{2-y}Mg_yCu_3O_x$ and $Y_2Ba_{2-y}Mg_yCuO_x$ have been made which are superconducting above liquid nitrogen, and follows the morphological development shown in FIG. 16 and support the images shown in FIG. 13 We observe that, upon prologued heating, YBCO crystals form multi-crystal agglomerate which transforms into a cracker-like morphology. Upon further heating, the cracker-like morphology is intercalated and unfolded into a 2-dimensional topology, eventually curling into a spiral morphology. This significant impact of adding $Mg^{2+}$ is also supported by the XRD pattern of FIG. 14 (b) where the YBCO peaks (013, 103), (123, 213) and (020, 200) normally seen to be indistinguishable are now clearly split and individually visible.

Visual observations in our laboratory showed that the new powder, S2, has a greater degree of residual magnetization and that that of the traditional $YBa_2Cu_3O_x$ composition.

The details of the unique structure, properties and the positioning of the $Mg^{2+}$ ions demonstrate that the powder can find application as an easily formable powdery material for construction of superconducting or highly insulating wire, powder, for superconducting devices such as superconducting magnetic energy storage (SMES), directed energy conversion (DEC), trapped energy storage (TES), 3D printed particle accelerators and free electron lasers, superconducting electronic components such as superconducting quantum interference devices (SQUID), Josephson junctions, circuit traces, Coulomb oscillators, quantum computer chips and or components related to such, or instruments such as superconducting digital multimeters, oscilloscopes, RF generators, and etc.

The new morphologies and topological materials made by incorporating elements such as Mg, are not just superconducting above liquid nitrogen but also have demonstrated enhanced properties such as; residual magnetism, Coulomb effects, electrostatic charge carrier, dual magnetic properties of attraction and repelling of normal and other superconducting materials, superior magnetic flux enhancements over previously known superconductors, higher current densities, electromagnetic field amplification and manipulation, superior RF sensitivities and other unusual properties.

Tables

The additional examples make reference to Tables 1 and 2, reproduced below. In these tables:

Table 1 shows a summary of the samples reported.

Table 2 (a) shows determination of Scherrer crystallite size of the MgO powder calcined at 500° C. K for 2 h from FWHM of the most defined peaks.

Table 2 (b) shows determination of Scherrer crystallite size from FWHM of the [200] reflection for the MgO powder calcined at different temperatures for 5 h.

TABLE 1

| Sample ID | Origin | Heat treatment |
|---|---|---|
| M1 | Precipitate | 500° C. for 2 h |
| M2 | Precipitate | 450° C. for 5 h |
| M3 | Precipitate | 500° C. for 5 h |
| M4 | Precipitate | 750° C. for 5 h |
| M5 | Precipitate | 1000° C. for 5 h |
| M6 | $MgCO_3$ | 1000° C. for 5 h |
| S1 | Precipitate containing Y, Ba, Cu | 970° C. for 12 h in oxygen |
| S2 | Precipitate containing Y, Ba, Cu, Mg | 970° C. for 12 h in oxygen |

TABLE 2 (a)

| Peak | 2θ (degrees) | θ (degrees) | d (Å) | FWHM (degrees) | FWHM (radians) | Scherrer Crystallite Size (nm) |
|---|---|---|---|---|---|---|
| [200] | 42.658 | 21.329 | 2.1178 | 1.645 | 0.029 | 5.01 |
| [220] | 61.930 | 30.965 | 1.4971 | 1.773 | 0.030 | 5.27 |
| [311] | 74.12 | 37.06 | 1.2781 | 1.67 | 0.029 | 6.02 |
| [222] | 78.18 | 39.09 | 1.2216 | 1.44 | 0.025 | 6.99 |

TABLE 2 (b)

| Calcining temperature (° C.) | FWHM (degrees) | FWHM (radians) | Scherrer Crystallite Size (nm) |
|---|---|---|---|
| 450 | 0.72 | 0.012 | 12.1 |
| 500 | 0.43 | 0.007 | 20.0 |
| 750 | 0.52 | 0.009 | 16.2 |
| 1000 | 0.42 | 0.007 | 20.8 |

Although preferred embodiments of the invention have been described herein in detail, it will be understood by those skilled in the art that variations may be made thereto without departing from the scope of the invention or of the appended claims.

The invention claimed is:

1. A process for producing a $LnM_{2-y}X_yCu_3O_x$ and/or $Ln_2M_{2-y}X_yCuO_x$ high-temperature superconductive powder, the process comprising:
   i) providing an aqueous solution of Ln, M, X and Cu and at least one mineral acid;
   ii) adding at least one sequestrating agent and, optionally, at least one dispersant to the solution to form a precipitate;
   iii) recovering the precipitate from the solution; and
   iv) heating the precipitate in a flow of oxygen to form the $LnM_{2-y}X_yCu_3O_x$ and/or $Ln_2M_{2-y}X_yCuO_x$ powder,
   wherein X is selected from the group consisting of Mg, Se, Sr, Ca and mixtures of two or more thereof,
   wherein Ln is a rare earth element, preferably Y, Ce, Dy, Er, Gd, La, Nd, Pr, Sm, Sc, Yb, or a mixture of two or more thereof,
   wherein M is selected from Ca, Sr, and Ba; and
   wherein y is from 0.1 to 0.8.

2. The process according to claim 1, wherein the powder has a morphology selected from the group consisting of cigars, spiral, spires, rods, tubes, cylinders, agglomerates and flat "cracker" shaped crystalline agglomerates.

3. The process according to claim 2, wherein the process further comprises:
   v) sintering the powder at a temperature of from 930° C. to 1010° C. to form a sintered high-temperature superconductive material.

4. The process according to claim 1, wherein X is Mg.

5. The process according to claim 1, wherein Ln is Y and/or M is Ba.

* * * * *